United States Patent [19]

Subramaniam

[11] 4,363,036

[45] Dec. 7, 1982

[54] METHOD AND APPARATUS FOR COMPRESSING DIGITAL DATA USING NON-ADAPTIVE PREDICTIVE TECHNIQUES

[75] Inventor: Ambati Subramaniam, Plano, Tex.

[73] Assignee: NCR Canada Ltd - NCR Canada Ltee, Mississauga, Canada

[21] Appl. No.: 244,352

[22] Filed: Mar. 16, 1981

[51] Int. Cl.[3] .............................................. H04N 7/12
[52] U.S. Cl. ........................... 358/261; 340/347 DD; 364/515
[58] Field of Search ............... 358/260, 261, 133, 135; 364/515; 340/347 DD

[56] References Cited

U.S. PATENT DOCUMENTS

| | | | |
|---|---|---|---|
| 3,769,453 | 10/1973 | Bahl et al. | 178/6 |
| 3,937,871 | 2/1976 | Robinson | 358/261 |
| 4,093,962 | 6/1978 | Ishiguro et al. | 358/138 |
| 4,215,375 | 7/1980 | Usubuchi et al. | 358/261 |
| 4,217,609 | 8/1980 | Hatori et al. | 358/136 |
| 4,259,693 | 3/1981 | Aaron et al. | 358/261 |

OTHER PUBLICATIONS

"Twodimensional Facsimile Source Encoding Based on a Markov Model", by Dieter Preub, NTZ-Aufsatze, pp. 358-363.
"Image Data Compression by Predictive Coding I: Prediction Image Data Compression Algorithms", by H. Kobayashi and L. R. Bahl, Mar. 1974, pp. 164-171.
"Some Extensions of the Ordering Techniques for Compression of Two-Level Facsimile Pictures", by F. W. Mounts, A. N. Netravali, and K. A. Walsh, Bell System Tech. Journal, Oct. 1978, pp. 3057-3067.

Primary Examiner—Michael A. Masinick
Assistant Examiner—Edward L. Coles, Sr.
Attorney, Agent, or Firm—J. T. Cavender; Albert L. Sessler, Jr.

[57] ABSTRACT

A method and apparatus for compressing digital data derived from an image using non-adaptive predictive techniques. A prediction table, which is pre-generated based on a number of sample images, generates a predicted pixel and source state for each pixel of the original image, as the original image is scanned. The predicted pixel is the expected value of the pixel when considering the values of a group of adjoining pixels, while the source state is indicative of the probability that the predicted pixel is in error. Prediction error pixels are then generated and grouped according to their respective source states to form a plurality of run length symbols with each symbol comprising a white portion and a black portion, which symbols are stored sequentially in order of formation in a memory device according to their respective source states. The symbols are used to provide address data for memory devices which generate variable length code words that are transmitted to a receiving station and decoded using the reverse of the aforementioned process to form a facsimile image.

34 Claims, 16 Drawing Figures

FIG-6

| # OF STATE, i | STATE, $S_i$ (BINARY PATTERN OF WINDOW) $X_1 X_2 X_3 \cdots X_{N-2} X_{N-1}$ | TOTAL FREQUENCY, FREQ. 1 = FREQ. 11 + FREQ. 12 + --- + FREQ. 1J ('J' IMAGES) | CONDITIONAL FREQ., FREQ. 2 = FREQ. 21 + FREQ. 22 + --- + FREQ. 2J ('J' IMAGES) | | CONDITIONAL PROBABILITY, $P(X_0/S_i) = \left(\frac{FREQ. 2}{FREQ. 1}\right)$ | | PREDICTION TABLE, (PREDICTED VALUE) $P_T(S_i)$ | SOURCE STATE TABLE, $S_S(S_i)$ |
|---|---|---|---|---|---|---|---|---|
| | | | $X_0 = 0$ | $X_0 = 1$ | $X_0 = 0$ | $X_0 = 1$ | | |
| 0 | 0 0 0 --- 0 0 | 100 | 98 | 2 | .98 | .02 | 0 | $S_0$ |
| 1 | 0 0 0 --- 0 1 | 60 | 5 | 55 | .084 | .916 | 1 | $S_3$ |
| 2 | 0 0 0 --- 1 0 | 50 | 48 | 2 | .960 | .040 | 0 | $S_1$ |
| 3 | 0 0 0 --- 1 1 | 1000 | 940 | 60 | .940 | .060 | 0 | $S_2$ |
| ... | ... | ... | ... | ... | ... | ... | ... | ... |
| L-3 | 1 1 1 --- 0 0 | 15 | 10 | 5 | .67 | .33 | 0 | $S_3$ |
| L-2 | 1 1 1 --- 0 1 | 40 | 2 | 38 | .05 | .95 | 1 | $S_1$ |
| L-1 | 1 1 1 --- 1 0 | 120 | 108 | 12 | .90 | .10 | 0 | $S_3$ |
| L=$2^{N-1}$-1 | 1 1 1 --- 1 1 | 200 | 150 | 50 | .75 | .25 | 0 | $S_3$ |

| STATE #, $i$ | PREDICTION & SOURCE STATE TABLE PROM ADDRESS, STATE, $S_{X_0}$, CORRESPONDING TO PIXEL, $X_0, S_{X_0} =$ $X_1 X_2 X_3 X_4 X_5 X_6 X_7 X_8 X_9 X_{10} X_{11} X_{12}$ | PIXEL $X_0$ | PREDICTED VALUE OF $X_0, (\bar{X}_0)$ | PIXEL $P_x$, OF PREDICTION ERROR LINE, $P_x = (X_0 \oplus \bar{X}_0)$ | SOURCE STATE $S_{X_0}$ OF PIXEL $X_0$ $S_i$ |
|---|---|---|---|---|---|
| 0 | 0 0 0 0 0 0 0 0 0 0 0 0 | 0 | 0 | 0 | $S_0$ |
| 0 | 0 0 0 0 0 0 0 0 0 0 0 0 | 0 | 0 | 0 | $S_0$ |
| 3585 | 1 1 1 0 0 0 0 0 0 0 0 1 | 1 | 1 | 0 | $S_1$ |
| 0 | 0 0 0 0 0 0 0 0 0 0 0 0 | 1 | 0 | 1 | $S_0$ |
| 3 | 0 0 0 0 0 0 0 0 0 0 1 1 | 0 | 0 | 0 | $S_2$ |
| 3 | 0 0 0 0 0 0 0 0 0 0 1 1 | 0 | 0 | 0 | $S_2$ |
| 2 | 0 0 0 0 0 0 0 0 0 0 1 0 | 1 | 0 | 1 | $S_1$ |
| 2 | 0 0 0 0 0 0 0 0 0 0 1 0 | 1 | 0 | 1 | $S_1$ |
| 2 | 0 0 0 0 0 0 0 0 0 0 1 0 | 1 | 0 | 1 | $S_1$ |
| 1 | 0 0 0 0 0 0 0 0 0 0 0 1 | 1 | 0 | 1 | $S_3$ |
| 3 | 0 0 0 0 0 0 0 0 0 0 1 1 | 0 | 0 | 0 | $S_2$ |
| 3585 | 1 1 1 0 0 0 0 0 0 0 0 1 | 1 | 1 | 0 | $S_1$ |
| 4094 | 1 1 1 1 1 1 1 1 1 1 1 0 | 0 | 1 | 1 | $S_3$ |
| 4094 | 1 1 1 1 1 1 1 1 1 1 1 0 | 0 | 1 | 1 | $S_3$ |
| 4095 | 1 1 1 1 1 1 1 1 1 1 1 1 | 0 | 1 | 1 | $S_3$ |
| 3 | 0 0 0 0 0 0 0 0 0 0 1 1 | 0 | 0 | 0 | $S_2$ |
| 0 | 0 0 0 0 0 0 0 0 0 0 0 0 | 0 | 0 | 0 | $S_0$ |
| 0 | 0 0 0 0 0 0 0 0 0 0 0 0 | 1 | 0 | 1 | $S_0$ |
| 0 | 0 0 0 0 0 0 0 0 0 0 0 0 | 1 | 0 | 1 | $S_0$ |
| 0 | 0 0 0 0 0 0 0 0 0 0 0 0 | 1 | 0 | 1 | $S_0$ |
| 0 | 0 0 0 0 0 0 0 0 0 0 0 0 | 0 | 0 | 0 | $S_0$ |
| 0 | 0 0 0 0 0 0 0 0 0 0 0 0 | 0 | 0 | 0 | $S_0$ |
| 3 | 0 0 0 0 0 0 0 0 0 0 1 1 | 1 | 0 | 1 | $S_2$ |
| 3585 | 1 1 1 0 0 0 0 0 0 0 0 1 | 0 | 1 | 1 | $S_1$ |
| 1 | 0 0 0 0 0 0 0 0 0 0 0 1 | 0 | 0 | 0 | $S_3$ |
| 2 | 0 0 0 0 0 0 0 0 0 0 1 0 | 0 | 0 | 0 | $S_1$ |
| 3 | 0 0 0 0 0 0 0 0 0 0 1 1 | 1 | 0 | 1 | $S_2$ |
| 3 | 0 0 0 0 0 0 0 0 0 0 1 1 | 0 | 0 | 0 | $S_2$ |
| 3 | 0 0 0 0 0 0 0 0 0 0 1 1 | 0 | 0 | 0 | $S_2$ |
| 4095 | 1 1 1 1 1 1 1 1 1 1 1 1 | 0 | 0 | 0 | $S_3$ |
| 1 | 0 0 0 0 0 0 0 0 0 0 0 1 | 0 | 0 | 0 | $S_2$ |
| 3 | 0 0 0 0 0 0 0 0 0 0 1 1 | 0 | 0 | 0 | $S_2$ |
| 4094 | 1 1 1 1 1 1 1 1 1 1 1 0 | 0 | 1 | 1 | $S_3$ |
| 4095 | 1 1 1 1 1 1 1 1 1 1 1 1 | 1 | 1 | 0 | $S_3$ |
| 3 | 0 0 0 0 0 0 0 0 0 0 1 1 | 1 | 0 | 1 | $S_2$ |
| 3 | 0 0 0 0 0 0 0 0 0 0 1 1 | 1 | 0 | 1 | $S_2$ |
| 0 | 0 0 0 0 0 0 0 0 0 0 0 0 | 1 | 0 | 1 | $S_0$ |
| 0 | 0 0 0 0 0 0 0 0 0 0 0 0 | 1 | 0 | 1 | $S_0$ |

| RUN LENGTH | RUN FEATURE | ENCODING SYMBOL | (7-BIT WHITE / 9-BIT BINARY PROM ADDRESS) BLACK) FOLLOWED BY 2-BIT ENCODER | VARIABLE LENGTH CODE WORD |
|---|---|---|---|---|
| 0 1 | 1,0 | 4 | 0 0 0 0 0 1 0 0 | 1 1 1 |
| 0 1 1 | 1,1 | 5 | 0 0 0 0 0 1 0 0 1 | 1 0 1 1 |
| 0 1 0 0 ⎫₃ | 1,3 | 7 | 0 0 0 0 0 1 0 1 1 | 1 0 1 0 |
| 0 0 1 | 2,0 | 8 | 0 0 0 0 1 0 0 0 0 | 1 0 0 1 |
| 0 0 1 0 0 ⎫₃ | 2,3 | 11 | 0 0 0 0 1 0 1 1 0 | 1 0 0 0 |
| 0 0 0 1 | 3,0 | 12 | 0 0 0 0 1 1 0 0 0 | 0 1 1 1 |
| 0 0 0 0 0 0 0 0 1 0 0 ⎫₃ | 8,3 | 35 | 0 0 1 0 0 0 1 1 0 | 0 1 1 0 |
| 0 0 ... 0 0 1 (38) | 38,1 | 153 | 1 0 0 1 1 0 0 0 1 | 0 1 0 1 |
| 0 0 ... 0 0 1 0 0 ⎫₃ (100) | 100,3 | 403 | 1 1 0 0 1 0 0 1 0 | 0 1 0 0 |
| 0 0 ... 0 0 (127) | 127,0 | 508 | 1 1 1 1 1 1 1 0 0 | 0 0 1 1 1 |
| 0 0 ... 0 0 1 (127) | 127,1 | 509 | 1 1 1 1 1 1 1 0 1 | 0 0 1 1 0 |
| 0 0 ... 0 0 1 0 (127) | 127,2 | 510 | 1 1 1 1 1 1 1 1 0 | 0 0 1 0 1 |
| 0 0 ... 0 0 1 0 0 ⎫₃ (127) | 127,3 | 511 | 1 1 1 1 1 1 1 1 1 | 0 0 1 0 0 |

| RUN LENGTH | RUN FEATURE | ENCODING SYMBOL | (6-BIT WHITE FOLLOWED BY 3-BIT BLACK) 9-BIT BINARY ENCODER PROM ADDRESS | VARIABLE LENGTH CODE WORD |
|---|---|---|---|---|
| 1 0 | 1,0 | 64 | 0 0 1 0 0 0 0 0 0 | 0 1 1 |
| 1 1 | 1,1 | 65 | 0 0 1 0 0 0 0 0 1 | 0 1 0 |
| 1 000...00 (63) | 1,63 | 127 | 0 0 1 1 1 1 1 1 1 | 1 1 |
| 1 1 0 | 2,0 | 128 | 0 1 0 0 0 0 0 0 0 | 0 0 1 1 |
| 1 1 1 | 2,1 | 129 | 0 1 0 0 0 0 0 0 1 | 0 0 1 0 |
| 1 1 000...00 (63) | 2,63 | 191 | 0 1 0 1 1 1 1 1 1 | 1 0 |
| 1 1 1 0 | 3,0 | 192 | 0 1 1 0 0 0 0 0 0 | 0 0 0 1 1 |
| 1 1 1 000...00 (63) | 3,63 | 255 | 0 1 1 1 1 1 1 1 1 | 0 1 0 |
| 1 1 1 1 1 1 000...00 (49) | 6,49 | 433 | 1 1 0 1 1 0 0 0 1 | 0 0 0 0 0 1 |
| 1 1 1 1 1 0 0 0 | 5,2 | 322 | 1 0 1 0 0 0 0 1 0 | 0 0 0 0 1 1 |
| 1 1 1 1 1 1 1 0 0 0 | 7,0 | 448 | 1 1 1 0 0 0 0 0 0 | 0 0 0 0 0 0 1 1 |
| 1 1 1 1 1 1 1 0 0 0 (7) | 7,3 | 451 | 1 1 1 0 0 0 0 1 1 | 0 0 0 0 0 0 1 0 |
| 1 1 1 1 1 1 1 000...00 (7, 63) | 7,63 | 511 | 1 1 1 1 1 1 1 1 1 | 0 0 0 0 0 0 0 0 |

FIG-10

| STATE | MEMORY LOCATION | SYMBOL b₀ b₁ b₂ b₃ b₄ b₅ b₆ b₇ b₈ b₉ b₁₀ b₁₁ b₁₂ b₁₃ | TERMINATED RUN LENGTH |
|---|---|---|---|
| $S_0$ | 0 0 0 0 | 0 0 0 0 0 0 0 1 0 0 0 0 1 1 | (2,0) |
| $S_1$ | 0 0 0 1 | 0 0 0 0 0 0 1 0 0 1 0 0 1 1 | (2,1) |
| $S_2$ | 0 0 1 0 | 0 0 0 0 0 0 0 0 1 0 0 1 0 1 | (SPECIAL SYMBOL) |
| $S_2$ | 0 0 1 1 | 0 0 0 0 0 1 0 0 0 1 1 0 0 1 | (1,1) |
| $S_3$ | 0 1 0 0 | 0 0 0 0 0 0 1 0 0 1 1 1 1 1 | (2,0) |
| $S_1$ | 0 1 0 1 | 0 0 0 0 1 0 1 0 0 0 1 1 1 1 | (1,0) |
| $S_3$ | 0 1 1 0 | 0 0 0 1 0 0 0 1 0 0 1 1 1 1 | (1,0) |
| $S_2$ | 0 1 1 1 | 0 0 0 0 1 1 0 1 0 0 0 0 1 1 | (3,2) |
| $S_0$ | 1 0 0 0 | 0 0 0 0 0 1 0 0 1 0 0 0 0 1 | (1,2) |
| $S_0$ | 1 0 0 1 | 0 0 0 0 0 0 1 0 0 0 1 0 0 0 | CURRENT $S_0$ SYMBOL(2,1) |
| $S_1$ | 1 0 1 0 | 0 0 0 0 0 0 0 1 0 0 0 1 0 0 | CURRENT $S_1$ SYMBOL(1,0) |
| $S_3$ | 1 0 1 1 | 0 0 0 0 0 0 0 0 1 0 0 0 1 1 | (1,1) |
| $S_3$ | 1 1 0 0 | 0 0 0 0 0 0 1 0 0 1 1 1 0 0 | CURRENT $S_3$ SYMBOL(1,0) |
| $S_2$ | 1 1 0 1 | 0 0 0 0 0 0 0 1 0 1 1 0 1 0 | CURRENT $S_2$ SYMBOL(2,0) |

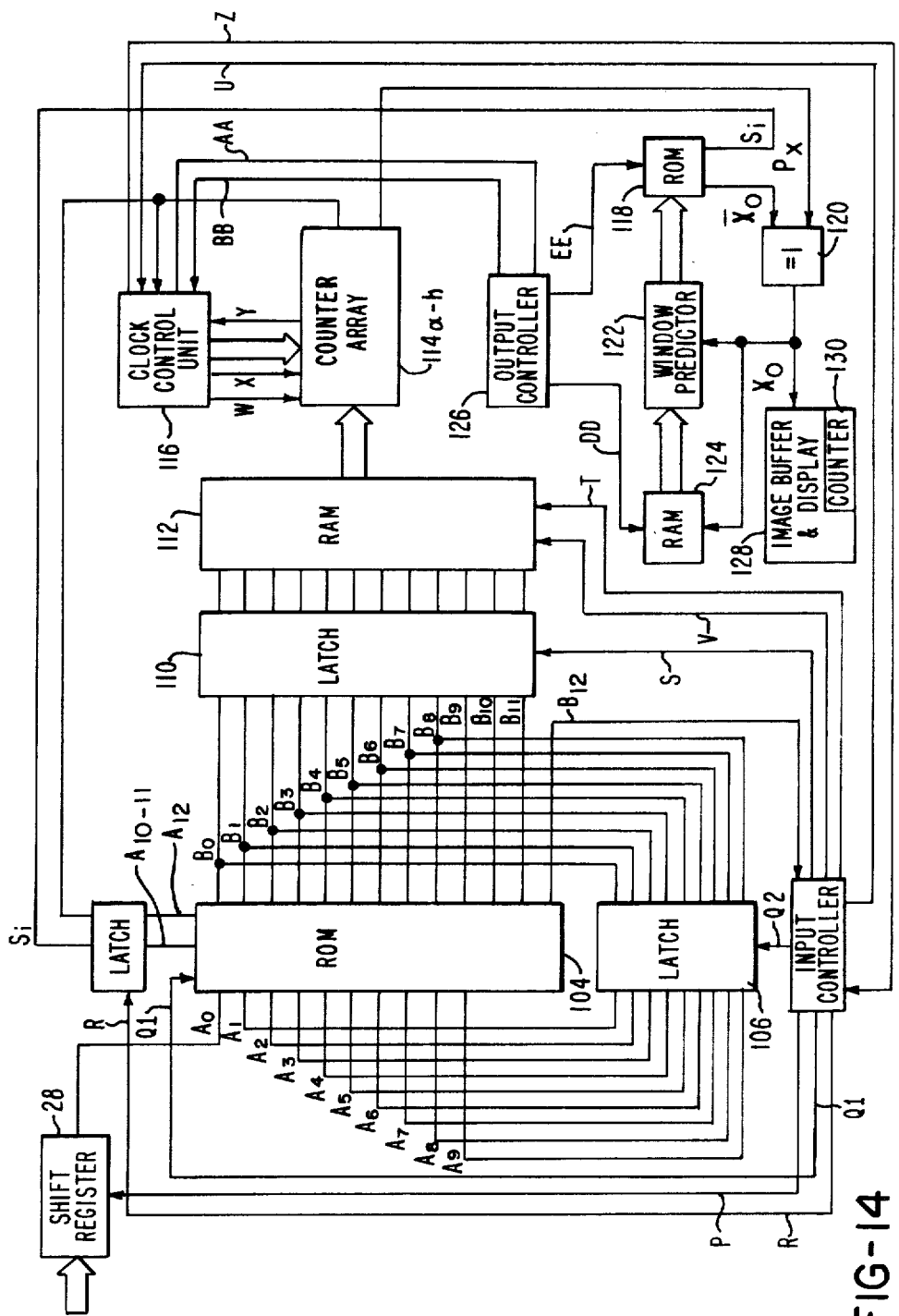

METHOD AND APPARATUS FOR COMPRESSING DIGITAL DATA USING NON-ADAPTIVE PREDICTIVE TECHNIQUES

CROSS-REFERENCE TO A RELATED APPLICATION

The present application is related to the copending U.S. Patent Application of Ambati Subramamiam, entitled "Method and Apparatus for Compression of Digital Data", Ser. No. 101,347, now U.S. Pat. No. 4,316,222, issued Feb. 16, 1982, assigned to the assignee of the present invention.

BACKGROUND OF THE INVENTION

This invention relates generally to a method and apparatus for data compression and, in particular, to a novel method and apparatus for reducing the number of bits of information needed to transmit a video image using a non-adaptive prediction technique.

In the transmission of digital data, it is desirable to reduce the amount of data to be transmitted as much as possible in order to reduce the bandwidth requirements of transmission medium and storage requirements. One technique which has proven useful is run length encoding. This particular technique consists of partitioning each row of the image into a sequence of runs, with each run including one or more adjacent picture elements, called pixels or pels, with the same binary value, and representing each run with a symbol or code which specifies the length of the run. Often these runs are represented by variable-length codes, such as a Huffman code set, and are assigned such that the shorter code words are used to represent the symbols which are more likely to occur, and the longer code words stand for symbols which rarely appear.

When the image data to be transmitted exhibits a high degree of redundancy, it has been shown that predictive encoding further improves the compression ratio. Predictive encoding is a technique by which a prediction may be made as to the value of a particular bit being processed based upon information gathered by examining surrounding data bits (pixels). The common method of predictive encoding is known as adaptive prediction. Examples of several prediction techniques may be found in U.S. Pat. No. 3,769,453 issued Oct. 30, 1973, to L. R. Bahl et al.; U.S. Pat. No. 4,093,962 issued June 6, 1978 to P. Ishiguro et al; and U.S. Pat. No. 4,215,375 issued July 29, 1980 to T. Usubuchi et al. When using adaptive prediction, a prediction table is generated for each image to be compressed using a window predictor (a window formed from surrounding pixels), which results in an optimum compression performance, for larger window size. However, since the prediction table to be generated is different for each image to be compressed, the full image must be completely stored in memory for each different image in order to generate a new prediction table; also, the generation of the prediction table and the performing of prediction on the image requires each image to be scanned twice by a window predictor (which consists of surrounding data bits), causing the amount of processing to be doubled.

In addition, since the prediction table is different for each image, the table must be transmitted from the compressor to the decompressor for each image in order to enable decompression of the image. Transmitting these excess bits, called overhead bits, seriously affects the compression performance. If the size of the window predictor increases, using more neighboring data bits in predicting the value of a particular bit, the amount of overhead bits to be transmitted also increases significantly. Therefore, it is necessary to keep the window predictor size small, which further degrades compression performance. Also, implementation of the adaptive predictor in real-time hardware is very complex and expensive.

However, a non-adaptive prediction technique can also be used to successfully compress digital data. In a non-adaptive predictive encoder, the prediction table, which is pregenerated based on a large number of sample images for a given window predictor of optimum size and shape and which is the same for all images to be compressed, is not optimum for the images, due to non-occurring states of the sample images. But since the pregenerated prediction table is stored in a permanent memory device, such as a read-only memory (ROM), at both the compressor and decompressor, no overhead bits must be transmitted, thereby improving the compression ratio. Also, since the overhead bit requirement increases as the size of the window predictor increases, a large window predictor can be used for the non-adaptive prediction technique, which results in improved compression performance when compared to the adaptive prediction technique. Also, since the same prediction table is used for all images, and no memory is needed to store the image, the hardware complexity and cost is also greatly reduced. Furthermore, the real-time compression/decompression processes will be significantly faster in the non-adaptive prediction technique than the adaptive prediction technique, since the image is scanned by the window predictor only once for performing prediction.

SUMMARY OF THE INVENTION

It is therefore an object of the present invention to provide a non-adaptive prediction technique to be used for compression and transmission of digital images, with improved compression performance.

It is also an object of the present invention to provide a novel method and apparatus for data compression which is easily implemented and at low cost.

Still another object of the present invention is to provide a method for compressing digital data without any loss of data bits.

These and other objects are accomplished in the present invention by an efficient lossless compression technique which consists of non-adaptive prediction followed by an efficient coding method. Non-adaptive prediction and source state tables are pregenerated based upon the Markov model of several source images, using an optimum window predictor. These tables are stored in a ROM at both the compressor and the decompressor. The prediction table and window predictor transform the facsimile image into a prediction error image, with minimum redundancy. The source state table is then used to classify the prediction error pixels which are ordered according to their source states. An efficient encoding method, which is the subject of the above-mentioned Subramaniam application and is fully incorporated into this application by reference, is applied to pixels of each state to minimize the number of symbols generated in each state. This encoding scheme also enables the continuation of runs in each state, from line-to-line, further improving compression performance.

The non-adaptive prediction technique, as opposed to adaptive, not only reduces the hardware cost of the compression/decompression apparatus considerably, without sacrificing performance, but also enables the system to operate at higher speeds in real-time, and to employ a larger window predictor, which further improves compression performance. In the adaptive prediction technique, the amount of overhead bits involved in transmitting the prediction and source state tables to the decompressor prohibits the use of a large window predictor, and also the storage of the full image requires a large RAM memory of at least 512 K bytes in most cases, in addition to the necessity for scanning the image twice with the window predictor for generating first a prediction table and then the prediction error pixels, which makes the compression process complex, expensive, and slow.

The numerous advantages of the present invention will become apparent to those skilled in the art from the following detailed description and a preferred embodiment.

BRIEF DESCRIPTION OF THE DRAWINGS

FIG. 6 shows a chart listing several selected samples of predicted values and source states generated using a given number of sample images and the window predictor of FIG. 2B.

FIG. 7 shows a chart which lists several examples of prediction error pixels and their corresponding source state values generated by using the window predictor of the preferred embodiment.

FIGS. 8A and 8B together show a chart which lists selected run lengths with corresponding features of the coding scheme employed for the facsimile system according to the present invention.

FIG. 10 shows a chart which lists the contents of the buffer memory as the two lines of data from FIG. 9 are processed using the present invention.

FIG. 14 shows the circuitry for the decompressor hardware used in the present embodiment.

DETAILED DESCRIPTION OF THE PREFERRED EMBODIMENT

It is well-known that an image may be divided into a series of rows of data elements of different types, such as black and white colors, which can be scanned by a device having an elemental area resolution enabling it to distinguish between the black and white elemental areas. The output of this scanning device is in digital form in which the white elements normally cause a "0" output signal to be generated and the black elements produce a "1" output signal.

Figure 1:
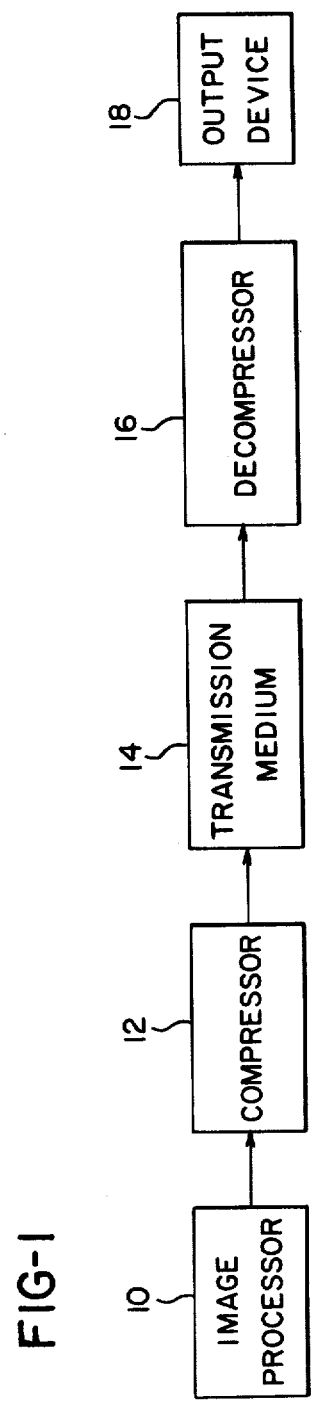
FIG. 1 is a block diagram of a data transmission system suitable for use with the present invention.

Data in this form can be compressed and conveyed via a transmission network to a remote receiver which will reconstruct the data to form an original image. FIG. 1 shows the overall arrangement of a typical system in which this can be accomplished. However, it is desirable to encode the data so that the image can be reconstructed by transmitting the fewest bits possible.

Referring now to FIG. 1, an image lift unit and processor 10 scans a facsimile image which is to be transmitted and converts the original image data into strings of ones and zeros. Image processor 10 in the present embodiment is a flying spot scanner of well-known construction, although another type of scanning system may be employed to provide the required data output. The data is sent in this form to a compressor 12, where it is transformed into a series of variable-length code words, and then transmitted over a transmission medium 14. The data is received at the other end of medium 14 by a decompressor 16, where it is reconverted, from the variable-length code words, into the original image and then transmitted to an output device 18, such as a CRT screen, where a reconstructed image of the original can be displayed.

Figure 2:
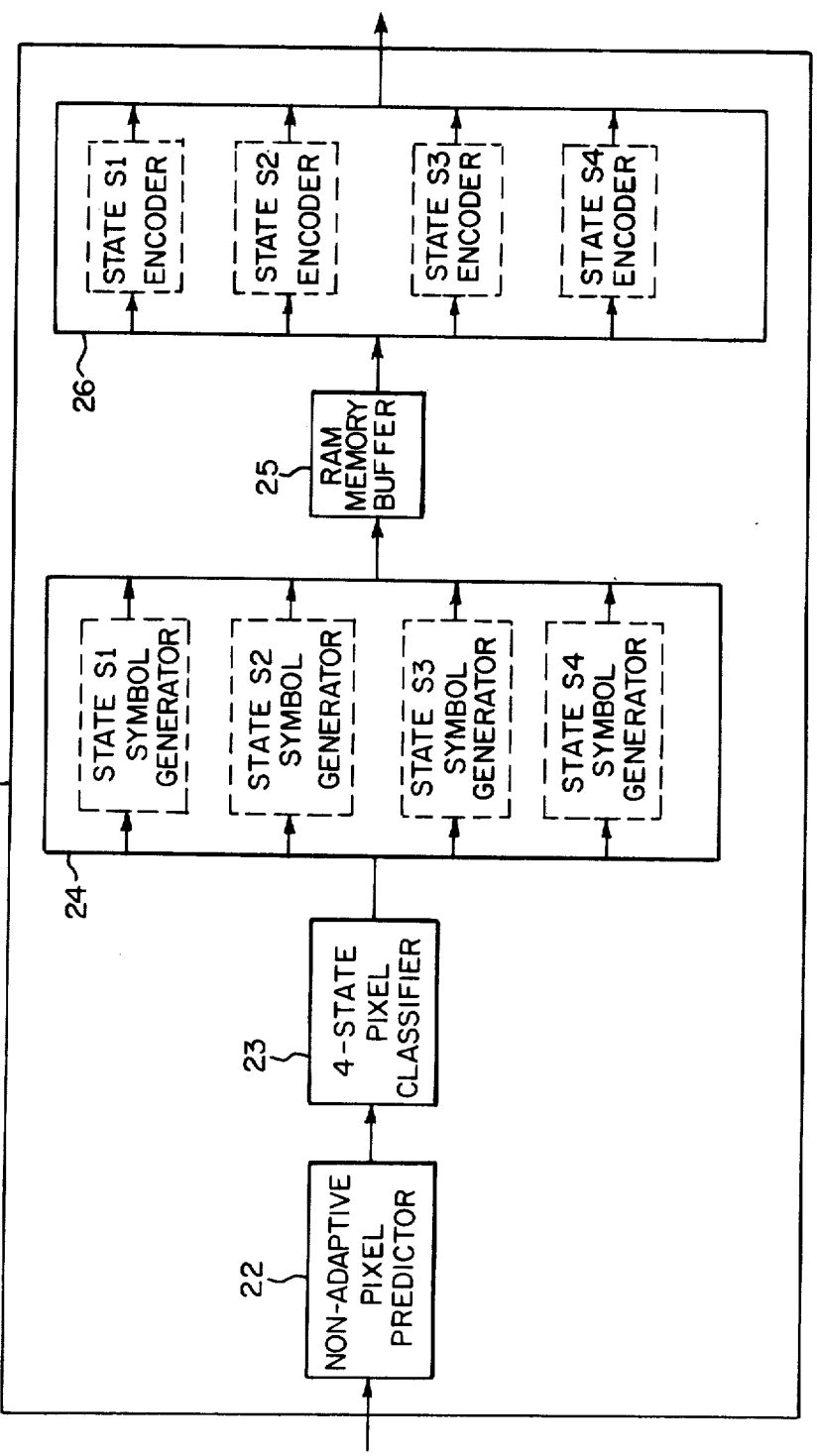
FIG. 2 is a block diagram detailing the compressor section of the preferred embodiment.

A block diagram showing the component parts of compressor 12 of this preferred embodiment is shown in FIG. 2. Compressor 12 contains a non-adaptive pixel predictor 22 and a four state prediction error pixel classifier 23. Pixel predictor 22 consists of a window predictor and a ROM storage device that contains the prediction table. The same ROM device will also contain the source state table, which is used by the pixel classifier 23. The size and shape of the window predictor, which is used to perform pixel prediction, should be the same as the predictor used to generate the prediction and source state tables. Pixel predictor 22 generates, for each input pixel, using the window predictor, an address to the prediction table stored in ROM, which table outputs the predicted value of that pixel. Pixel predictor 22 generates the prediction error pixel, and pixel classifier 23 then uses the same window predictor and the source state table to classify the prediction error pixels into different source states.

Compressor 12 also contains a symbol generator unit 24, which consists of a separate symbol generator for each source state. Each symbol generator generates symbols from prediction error pixels of that state. Since the order in which the symbols are generated in each state is important to decompressor 16, the symbols, when generated, are stored in order of occurrence in a RAM memory buffer 25. Compressor 12 also contains a symbol encoder unit 26, which consists of a set of encoders, one for each source state. Thus, symbols of each source state are encoded by the encoder of that state. The outputs of the encoders, when generated, are combined in first in-first out fashion and transmitted over medium 14.

Figure 3:
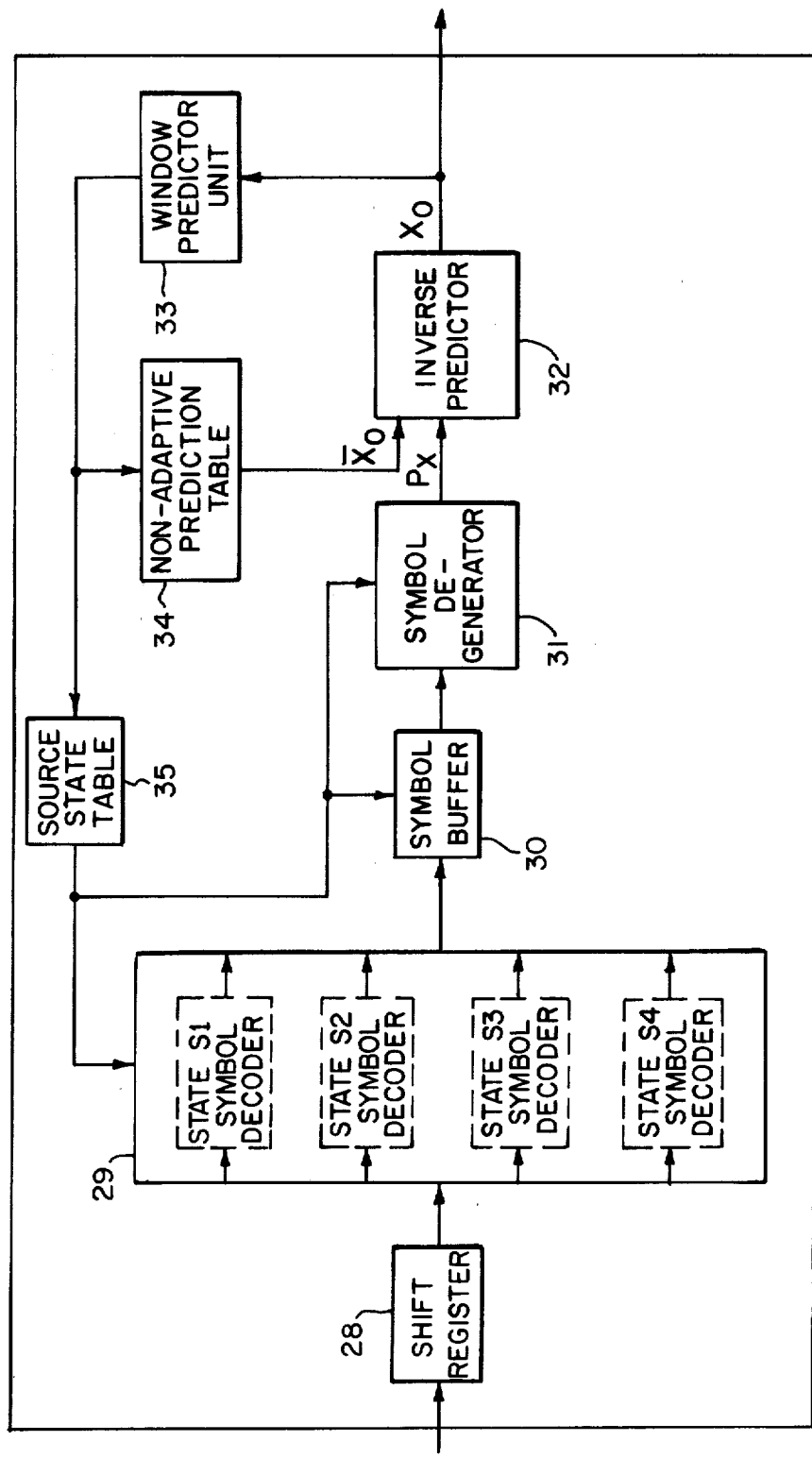
FIG. 3 is a block diagram detailing the decompressor section of the preferred embodiment.

A block diagram of decompressor 16 showing its component parts is shown in FIG. 3. Decompressor 16 consists of a parallel in-serial out (PISO) shift register 28, symbol decoder unit 29, symbol buffer 30, symbol degenerator unit 31, inverse predictor 32, window prediction unit 33, non-adaptive prediction table 34, and source state table 35.

The PISO shift register 28 converts the compressed image bytes from compressor 12 into serial data and shifts the data bit-by-bit into decoder 29, as required by this decoding method. The symbol decoder unit 29 consists of a set of decoders, one for each source state. Each state decoder contains ROM decoding tables to decode the run length symbols belonging to that source state. Symbol buffer 30 stores one decoded symbol in each source state, which symbols are waiting to be decompressed. When a decoded symbol in any state is transmitted to degenerator 31 to be decompressed, then a new symbol is decoded in that same source state and inserted into buffer 30. The symbol degenerator unit 31 consists of a set of counters, one for each color in each state. These counters convert each run length into the individual pixels which were represented by that run length symbol. These pixels are the actual prediction error pixels, and are converted back into original pixels by using inverse predictor 32, window prediction unit 33, and prediction table 34. Window prediction unit 33 consists of a RAM storage device, which stores several scan lines of pixels required to form a thirteen pixel window, and generates a twelve bit address for prediction table 34. The non-adaptive prediction table 34, which is contained in a ROM device, outputs a predicted value $X_O$ for each pixel $P_X$ outputted from symbol degenerator unit 31 to inverse predictor 32 for each input window address. The inverse predictor 32 then outputs the original pixel $\overline{X}_O$ to an output device 18. The source state table 35, contained in a ROM device, generates, for each input window address (generated by window prediction unit 33), the source state required by decoder unit 29, buffer 30 and symbol degenerator unit 31 to decode and decompress a symbol in that state.

The decompression technique consists of decoding symbols in any state, and then decompressing the decoded symbols into original scan lines of pixels. Initially, the decoder ROM address is set to memory location 0000, and a WB symbol from $S_0$ state decoder is decoded first, due to the fact that the pixels of first 3 scan lines belong to $S_0$ state, as will be described in greater detail subsequently. This run length symbol is decompressed into prediction error pixels, and since the pixels of first 3 scan lines are not predicted, these decompressed pixels are identical to the original pixels, which form scan lines of reconstructed image, and also are used to construct the window predictor. The window predictor then generates an address to the ROM source state and prediction tables. The source state table outputs the source state, which is used to generate new symbols to be decoded, and is also used by the symbol degenerator to decompress the decoded symbols into prediction error pixels. The prediction table outputs the predicted value of the pixel to be reconstructed by the decompression logic.

A decoded symbol in any state is loaded into the symbol degenerator of that state. The symbol degenerator for each state consists of two counters, one for decompressing white half runs and the other for decompressing black half runs of the decoded symbol in that state. Since each symbol is composed of two half run lengths, the first half run is decompressed first, followed by the second half run of the symbol. The color of the first half run of the symbol is specified by the decoder 29 output for that decoded symbol. This color information is used to load the first half run of the symbol into the appropriate counter. When the first half run is completely decompressed, as indicated by its counter, then the second half run of this symbol is loaded into the appropriate counter, depending upon its color, and is decompressed pixel-by-pixel. For each pixel decompressed, the source state is generated from the source state ROM table for the window address represented by the pixel pattern (state), $S_i = [X_1 X_2 \ldots X_{12}]$.

If the source state changes in the middle of decompressing either first half run or the second half run of a particular symbol, the remaining parts of the run lengths being decompressed are left in their respective counters, and degenerator 31 switches to the counters containing the symbol representing the new source state and proceeds to decompress pixels in that state from left-over run lengths stored in the counters of that state, in the color in which it was previously being decompressed. If it is the first half run, then that half is decompressed, followed by its second half run; or, if it is the second half run, then that half is decompressed into prediction error pixels. If, at any stage, during the decompression process, the counter of the second half run of any state reaches zero, indicating that the symbol in that state is completely decompressed, a new symbol in that state is obtained from buffer RAM 30, or if the RAM is empty, a new symbol is decoded from the decoder ROM tables of that state, and its two half runs are then loaded into their respective counters and decompressed until either the run lengths are completely decompressed or the state changes. This procedure or decode/decompress is continued until pixels of all scan lines of the image are reconstructed.

In the preferred embodiment, compressor 12 and decompressor 16 contain the non-adaptive prediction and source state tables which are employed to convert the original high redundancy image data into low redundancy prediction error image data. These tables are pregenerated using a group of sample images. A convenient measurement, called entropy, is available for evaluating a probability based on a finite number of observations distributed over a given number of these samples. Entropy is essentially a measurement of the uncertainty that exists in a situation. By decreasing the entropy in the present system, the percentage of compression will increase. Therefore, it is necessary to seek the lowest possible level of entropy for the best results, since the compression ratio is equal to the inverse of the entropy.

Since the non-adaptive predictive technique is based on the estimation of the theoretical lower bound entropy, the method used for calculating this lower bound entropy will now be shown. This method was initially described in an article entitled "Coding of Two-Tone Images" by T. S. Huang, in IEEE Trans. on Communications, Vol. COM-25, No. 11, November, 1977. For a given source image, the lowest achievable entropy is produced by a two-dimensional Markov model of the source image. A Markov model is based upon the premise that the outcome of any event is dependent upon the immediately preceding event. The digitized source image can be considered as a sample function of a two-dimensional random process characterized by the joint probability distributions of all orders. Assuming that the image is infinite in extent and that the random process is stationary, then the minimum achievable bit-rate is equal to the conditional entropy of the Markov model of the source image. However, in practice, since the image is finite, if the upper bound on the minimum achievable bit rate is calculated by measuring frequency distributions (histograms) rather than probability distributions, then the assumptions made are not necessary.

Figure 4A:
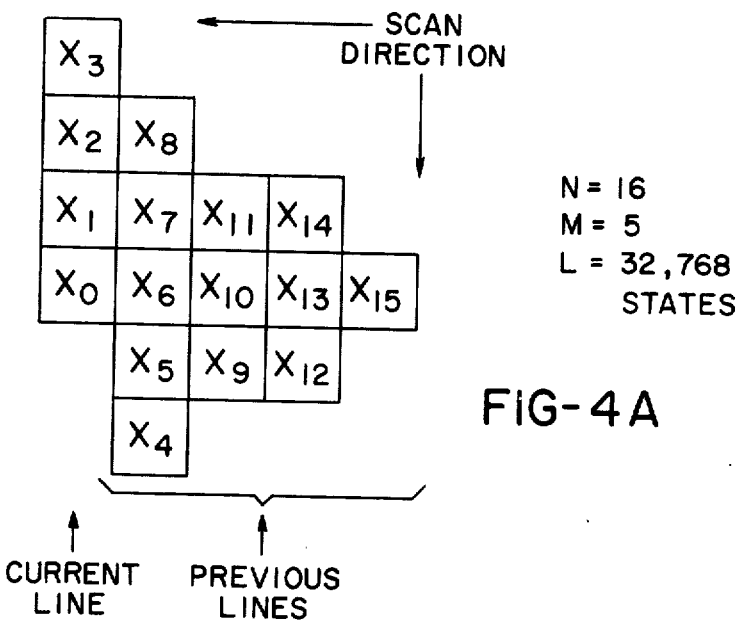
FIGS. 4A and 4B show different configurations for a window predictor which may be employed with the present invention.
Figure 4B:
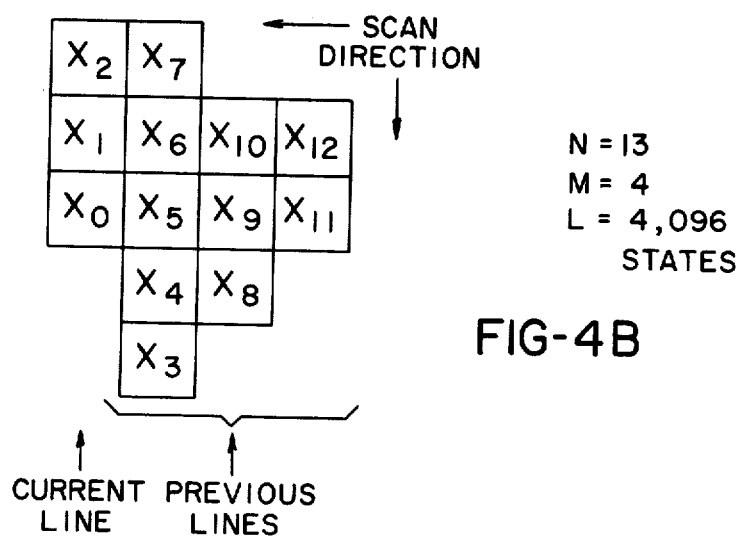

The two-dimensional Nth order Markov model consists of a window predictor made up of N pixels, $X_0, X_1, X_2 \ldots, X_{N-1}$, in which the current pixel $X_0$ is assumed to be statistically dependent on (N−1) previously transmitted pixels, which were located in the same scan line and also from previous scan lines. Two such window predictors are shown in FIGS. 4A and 4B. The window predictor is generated by using N pixels taken from M scan lines, which include both the current line and the previous lines. Since the lower bound entropy is sensitive to window size and shape, the window shape must be optimized for the N pixels. The optimum shape of the window is one which reflects a maximum amount of correlation between the pixel to be predicted $X_0$, and the remaining (N−1) neighboring pixels, $X_1, X_2, \ldots, X_{N-1}$. A window predictor consisting of N pixels also generates L number of states, where $L = 2^{N-1}$. A state is defined as the binary combination represented by the (N−1) pixels. In the preferred embodiment, it was determined experimentally that the optimum window predictor consists of 13 pixels from four scan lines, generating 4,096 states. The optimum shape of the window for N = 13, also determined experimentally, is that shape shown in FIG. 4B.

The relationship between the current pixel $X_0$ and the (N−1) previously transmitted pixels may be expressed as the conditional probability of $X_0$, given $X_1, X_2, \ldots, X_{N-1}$, which is written as $p(X_0|X_1, X_2, \ldots, X_{N-1})$. Each of these pixels may be either black (1) or white (0). Since the Nth order joint probability of these pixels can be expressed as $p(X_0, X_1, X_2, \ldots, X_{N-1})$, then the theoretical achievable lower bound entropy of the Nth order Markov model is expressed as:

$$e_{LB} = \underset{N \to \infty}{Lim} \left[ - \underset{x_1, x_2, \ldots, x_{N-1}}{\Sigma} p(x_0, x_1, \ldots, x_{N-1}) \log_2 \right.$$

$$\left. p(x_0|x_1, \ldots, x_{N-1}) \right], \text{bit/pixel}$$

For any finite N, this expression yields $e_N$, which represents the upper bound on the achievable lower bound entropy, $e_{LB}$.

Figure 5:
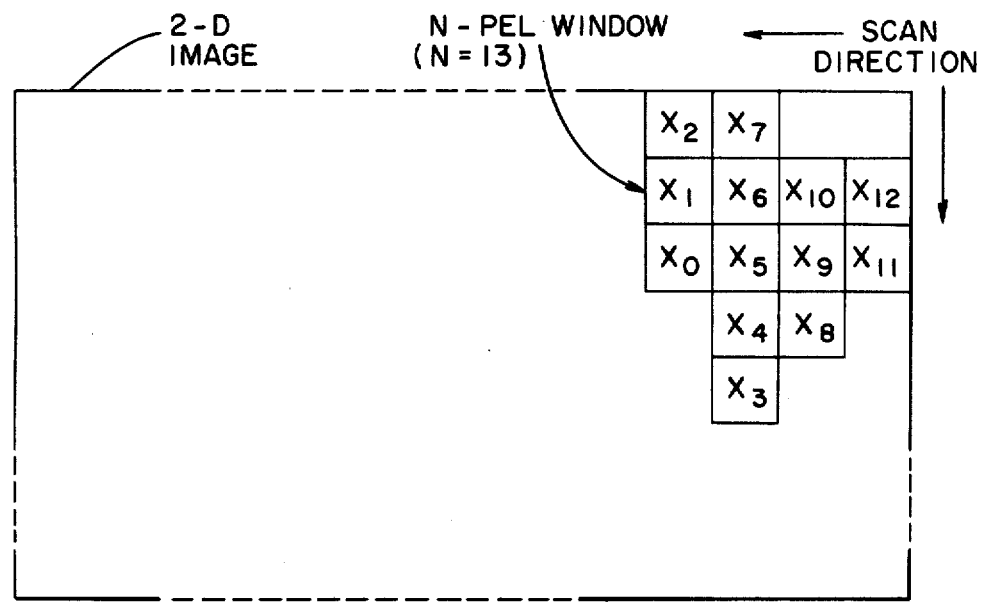
FIG. 5 is a diagram showing the scan directions for the window predictor across the document for the preferred embodiment.

The conditional entropy is calculated from the joint and conditional probabilities, which are generated, in turn, from the joint and conditional frequencies of occurrence of each state. For each state, $S_i$, the joint and conditional frequencies are obtained by updating frequency tables for each position of the window predictor (as the window is moved across the scan line one pixel at a time) corresponding to the state represented by the window predictor. The window is moved, beginning in the upper right corner of the document, from the top to the bottom within each scan line of the image, and from right to left across the image, as is shown in FIG. 5. As the window moves, the frequency tables are updated for each window position, and continues until all scan lines of the image have been scanned. This procedure is repeated for each of the images taken in the samples used to generate the prediction and source state tables.

The conditional entropy for N number of pixels may be expressed by:

$$e_N = - \overset{2^{N-1}-1}{\underset{S_i, i=0}{\Sigma}} p(X_0 = 0, S_i) \log_2 (x_0 = 0|S_i) - \overset{2^{N-1}-1}{\underset{S_i, i=0}{\Sigma}}$$

$p(x_0 = 1, S_i) \log_2 p(x_0 = 1|S_i)$, bit/pixel

The lower bound based on joint entropy is given by the expression $$E_N = \underset{N \to \infty}{Lim} \frac{1}{N} \left[ - \underset{x_0, x_1, \ldots, x_{N-1}}{\Sigma} p(x_0, x_1, \ldots, x_{N-1}) \log_2 \right.$$

$$\left. p(x_0, x_1, \ldots, x_{N-1}) \right], \text{bit/pixel}$$

The lower bound entropy is given by $$e_{LB} = \underset{N \to \infty}{Lim} e_N = \underset{N \to \infty}{Lim} \frac{E_N}{N}$$

However, as N becomes large, such as N = 16, $e_N$ can be approximated by $e_{LB}$.

Using the aforementioned relationships, non-adaptive prediction and source state tables can be generated for the preferred embodiment. A conditional frequency table must first be generated for each of the sample images. The conditional frequency tables generated for each image are then added over the number of sample images to generate an accumulated frequency table. In this accumulated frequency table, the following relationships are used:

FREQ 1 = FREQ 11 + FREQ 12 + ... + FREQ $1_i$
$1 \leq i \leq J$, where J is the number of images in the sample, and FREQ 1i is the frequency of the ith image, and is derived from the equation:

FREQ $1i$ = FREQ $2i|_{x0=0}$ + FREQ $2i|_{x0=1}$, where
FREQ $2i|_{x0=0}$ = FREQ $21|_{x0=0}$ + FREQ $22|_{x0=0}$ + ... + FREQ $2i|_{x0=0}$; $1 \leq i \leq J$,
and FREQ $2i|_{x0=1}$ = FREQ $21|_{x0=1}$ + FREQ $22|_{x0=1}$ + ... + FREQ $2i|_{x0=1}$; $1 \leq i \leq J$.

When the conditional frequencies are calculated, the conditional probabilities can then be determined by using the following relationships:

$$p(x_0 = 0|S_j) = \left[ \frac{\text{FREQ } 2|x_0 = 0}{\text{FREQ } 1} \right]$$

and $p(x_0 = 1|S_j) = 1.0 - p(x_0 = 0|S_j)$, where $S_j$ is the jth state, $0 \leq j \leq L$, and $L = 2^{N-1} - 1$ = the number of states generated by the N-pixel window.

The prediction table can now be generated from the conditional probability table, by using the following relationships:

$P_T(S_j) = 0$ if $p(x_0=0|S_j) > 0.5$;

$P_T(S_j) = 1$, otherwise, where $P_T(S_j)$ is the predicted value for state $S_j$, $0 \leq j \leq L$, and $p(x_0=0|S_j)$ is the conditional probability that the pixel $x_0$ is 0 given that the state of the (N−1)

pixel window is $S_j$. The content of the prediction table, therefore, is the predicted value of $x_0$ for a given position of the window predictor represented by $S_j$.

The source state table can also be generated using the conditional probability table. It should first be assumed that the L states of the window predictor are classified into K source states, $S_{s_0}, S_{s_1}, \ldots, S_{s_{k-1}}$. Then, if the conditional probability for any state $S_j$ of the prediction being successful is expressed by $P_s(x_0|S_j)=0.9$, the conditional probability of the prediction being an error is $P_e(x_0|S_j)=1.0-P_s(x_0|S_j)=0.1$.

Using this relationship, the L states of the window predictor can now be classified into K source states, depending upon the value of the probability of the prediction being in error, which is classified as $P_e(x_0|S_j)$. The source states are represented as:

$S_0$ state, for which $P_e(x_0|S_j)$ is $\leq T_1$
$S_1$ state, for which $T_1 < P_e(x_0|S_j) \leq T_2$
.
.
.
$S_{K-2}$ state, for which $T_{K-2} < P_e(x_0|S_j) \leq T_{K-1}$
and $S_{K-1}$ state, for which $P_e(x_0|S_j) > T_{K-1}$ The variables $T_1, T_2, \ldots T_{K-2}, T_{K-1}$, represent a set of $(K-1)$ threshold values. These threshold values range from 0.0 to 0.5.

In the preferred embodiment, the prediction and source state tables were generated by using the window predictor shown in FIG. 4B on 45 sample images; a chart showing selected samples of the results is shown in FIG. 6. The states were divided into four source states, $S_0$, $S_1$, $S_2$, and $S_3$, with threshold values of $T_1=0.025$, $T_2=0.050$ and $T_3=0.075$. These tables are stored in the ROMs contained in the compressor and decompressor hardware of the system.

The two-dimensional image is processed on a line-by-line basis, and, for each scan line, on a pixel-by-pixel basis. The pixels of each line are predicted using the window predictor shown in FIG. 4B and the prediction table (ROM table) shown in FIG. 6. The window predictor, which consists of 13 pixels (N=13), is formed from pixels of current scan line and 3 previous scan lines as shown in FIG. 4B. In that figure, pixel $X_0$ is the current pixel to be predicted and the pixels $X_1, X_2, X_3, \ldots, X_{12}$, which are previously scanned pixels from the 4 scan lines, comprise the state for each position of the window, which state is used as an address to the ROM prediction and source state tables. Since there is no correlation between top pixels of the current line and bottom pixels of the previous line, the prediction is performed strictly on line-by-line basis.

The pixels of first 3 scan lines and top two pixels and bottom two pixels of each line are not predicted since a window address cannot be formed for these pixels. Thus, the prediction error pixels for these pixels are the same value as their original pixels.

For a given position of window predictor, the prediction error pixel, $P_X$, for pixel $X_0$, is generated as follows:

$P_X = X_0 \oplus \bar{X}_0$, where $\bar{X}_0$ is the predicted value of pixel $X_0$, which is obtained from the ROM prediction table corresponding to the ROM address (state) defined by the pixel pattern, $S_i=[(X_1X_2X_3 \ldots X_{12})]$, of the window, as is shown in FIG. 6, and '$\oplus$' is the modulo-2 or the EXCLUSIVE-OR operation. The window is then shifted down by one pixel position and a prediction error generated for a new pixel $X_0$ corresponding to this window position. This procedure is repeated until end of scan line is reached. Then, the window is shifted to the left by one pixel position (i.e.; next scan line) and prediction error pixels are generated for the new scan line, from top to bottom. This procedure is repeated for all scan lines of the image. A listing of prediction error pixels for two scan lines of pixels, along with the respective source state values, is shown in the chart contained in FIG. 7. It should be noted that the length of the prediction error scan line is exactly identical to the length of the original scan line, but the redundancy in prediction error image is much less than the redundancy in the original image.

As a prediction error pixel is being generated for each of the pixels in a scan line using the window predictor, the source state to which the prediction error pixel belongs is also generated, using the same window predictor, from the ROM source state table. The address for the ROM source state table is given by the pixel pattern (state), $S_i=[X_1X_2 \ldots X_{12}]$, of the window predictor. The output of the ROM table, for a particular input address, is the source state representing the prediction error pixel for that address. The pixels that are not predicted (pixels of first 3 scan lines and the two pixels at top and bottom of each scan line) are assumed to belong to source state $S_0$. Since the classification of source states is based on the probability of prediction being in error, pixels in $S_0$ state will be mostly zeroes (white) and pixels in $S_3$ state will be mostly ones (black), while states $S_1$ and $S_2$ may consist of almost equal number of zeroes and ones. This arrangement enables proper selection of maximum run lengths for white and black half runs of WB and BW symbols.

When working with checks or other similar documents, when the original image data is converted into the prediction error image, it often consists of long strings of zeroes followed by short strings of ones, and short strings of ones followed by long strings of zeroes. These characteristics made it possible to develop a method of encoding which generates two types of run lengths, further improving the compression performance. This method, which was invented by the present inventor and assigned to the assignee of the present invention, is the subject of U.S. patent application Ser. No. 101,347. In this encoding method, one run length type is a white-black (WB) run, and the other is a black-white (BW) run. Each of these runs has two sections, called a black half and a white half.

The WB run length in the above-mentioned application consists of a white half run of from 1 to 511 pixels, followed by a black half run of from 0 to 7 pixels. The BW run length consists of a black half run of from 1 to 7 pixels followed by a white half run of from 0 to 511 pixels. Thus, the maximum value for a white half run is 512 (0 to 511), and the maximum value of a black half run is 8 (0 to 7). These maximum limits may be chosen to optimally suit the type of images to be processed and the cost of hardware implementation.

The present invention uses a generalized variation of this method. In the generalized method, the WB symbol consists of a white half run length of from 1 to $M_1$ pixels, followed by a black half run length of from 0 to $M_2$ pixels, and the BW symbol consists of a black half run length of from 1 to $M_3$ pixels, followed by a white half run length of from 0 to $M_4$ pixels, where $M_1$ through $M_4$ represent maximum run length values. In the preferred implementation for the present invention, the maximum values chosen are $M_1=128$, $M_2=4$, $M_3=8$, and $M_4=64$. However, these values are arbitrary and can be changed by hardware modification.

The encoding scheme for the generalized method can be expressed by the following equations:

$$S=(x_1 \cdot M_2)+y_1 \text{ for WB runs;} \quad (1)$$

$$S=(x_2 \cdot M_4)+y_2 \text{ for BW runs;} \quad (2)$$

where S is the encoding symbol, $x_1$ and $x_2$ are the lengths of the first half of a particular run, $y_1$ and $y_2$ are the lengths of the second half of that same run, $M_4$ is the maximum length of a white half run of a BW symbol, and $M_2$ is the maximum length of a black half run of a WB symbol. In the preferred embodiment, the maximum value of $M_1$ is 4, the maximum value of $M_4$ is 64, the maximum values of $X_1$ and $Y_1$ are 127 and 3, respectively, for a WB run, and the maximum values of $X_2$ and $Y_2$ are 7 and 63, respectively, for a BW run. FIGS. 8A and 8B comprise a chart showing several sample run lengths of WB and BW runs with corresponding run features, encoding symbol values, and corresponding code words used in the embodiment disclosed in the present application.

This combined black and white run length encoding scheme is easily implemented by following several rules. These rules make it possible to use this scheme to achieve substantial compression performance.

The general rule of this encoding scheme is that the first half of any run feature must be terminated before the second half may begin. For example, the black half of a BW run length is terminated by a zero before the white half is generated. To demonstrate this rule, consider a group of five black pixels followed by three white pixels in a BW run length (11111000). The first white pixel following the black half is used to terminate the black half run before the white half is started. The remaining two white pixels constitute the white half run. The run feature for this particular BW run length is coded (5,2) and, using equation #2, the encoding symbol is calculated to be 322, as shown in FIG. 8B. Another situation where this rule is applied is illustrated by a WB run length in which eight white pixels are followed by four black pixels (000000001111). Here, the white half must be terminated by a one before the black half can be generated. Therefore, the first black pixel following the eight white pixels is used to terminate the white half run. The remaining three black pixels comprise the black half run. The run feature for this WB run length is (8,3), and the encoding symbol using equation #1 is 35, as shown in FIG. 8A.

An exception to this general encoding rule applies when the length of the first half of a run exactly equals the maximum number of pixels allowed for that particular color. To illustrate this, consider a BW run length of seven black pixels followed by three white pixels (1111111000). Since $M_3$, which is the maximum value for a black half run, is equal to 8, the maximum number of pixels allowed in the black half of a BW run is 7. In the example, therefore, the first half run length exactly equals the maximum allowable number of pixels for that color. When this situation occurs, the first half of the run length does not have to be terminated, and the second half begins with the next pixel. In the example, all three white pixels constitute the second half of the run length, and the run feature for this particular run length is coded (7,3) and the corresponding encoding symbol, using equation #2, is 451, as shown in FIG. 8B.

If the first half of a run length exceeds the maximum length specified for that particular color, then that run length must be broken down by using both the general rule and its exception. For example, take the situation in which a sequence of a series of 165 white pixels followed by two black pixels is encountered when the system is in the WB mode. Since the maximum number of pixels allowed in a white half run is 127, the white run length exceeds the maximum in this example. This situation is solved by using the first 127 pixels of the white run for the white half of the WB run, and using a length of 0 for the black half, which follows the exception to the general rule. The run feature for this WB run length is coded (127,0), which provides an address of 508 for the PROM for the code word representing the first part of this sequence, as is shown in FIG. 8A. The remaining 38 white pixels may be combined with the two black pixels in a WB run length by using the general rule. The run feature for this WB run length is coded (38,1), which provides a PROM address of 153 for a second code word representing the remainder of the sequence.

If the second half of a run length exactly equals the maximum length allowed for that particular color, then that run length may be encoded following the general encoding rule. However, if the second half of a run length exceeds the maximum allowable length, a special method must be used to encode the data.

When the second half of the run exceeds the maximum, the run length is encoded for the maximum length allowed for that color, then a special symbol is generated to provide a further PROM address, which indicates the symbol has switched to the opposite type run. The remaining pixels are then encoded as the first half run of the opposite type run length by following the general rule. To illustrate this situation, consider a run in the WB mode which contains 100 white pixels, followed by 10 black pixels, which are followed by 50 white pixels. The 100 white pixels are terminated by the first black pixel, and the next three pixels, which is the maximum number of pixels allowed for a black half run, are combined with the previous white pixels to generate a WB run which is a run feature coded (100,3) to provide a PROM address of 403. Following this run length, the special symbol is generated, constituting an address for a code word which indicates to the decoder that the run pattern is switching from WB runs to BW runs. After the special symbol, the remaining six black pixels are combined with the next run of 50 white pixels following the general rule to generate a BW run which has a run feature coded (6,49) for a PROM address of 433. The coding method now continues using BW runs until it is necessary to switch back to the WB run length.

In applying this encoding method to the preferred embodiment, the combined black and white run length (CBWRL) symbols are generated in all four source states from prediction error pixels of each scan line. The first symbol generated for each image will normally be a WB symbol in the $S_0$ state. If the first pixel encountered is a zero, the symbol will be a WB symbol. On the other hand, if the first pixel encountered is a one, a special symbol must be generated before generating a BW symbol.

However, due to the fact that the symbols in different states are generated independently, the symbol generated in one state may not have been terminated when the state changes to another state. In addition, the last symbol in each state might not have been terminated when the end of the scan line is reached. These run symbols will be stored in a buffer and later updated in their respective states from pixels of subsequent scan lines. Thus, the first non-terminating run symbol generated in each state starting from state $S_0$ and the following symbols generated in other states are stored in empty locations of a buffer memory in the order that they occur, starting from the first empty location in the buffer. These symbols cannot be transmitted until the first non-terminating symbol in the buffer becomes terminated and transmitted, because the order in which symbols of different states occur is important for decompression.

In the preferred embodiment, the arrangement of the 1K×16 bit RAM buffer storage is as follows: nine bits ($b_0$–$b_8$) represent the value of the symbol, with bits $b_0$–$b_5$ representing the white half for BW runs and bits $b_0$–$b_6$ representing the white half for WB runs, and with bits $b_6$–$b_8$ representing the black half for BW runs and bits $b_7$–$b_8$ representing the black half for WB runs; one bit ($b_9$) represents the initial color of the symbol; two bits ($b_{10}$–$b_{11}$) represent the source state of the symbol; one bit ($b_{12}$) represents the working color of the symbol at the time when the state changes; and one bit ($b_{13}$) represents run termination information (whether the symbol is terminated or unterminated).

If, in a subsequent prediction error line, the first pixel belongs to a state in which there is a non-terminating run in the buffer, the symbol representing that state is read from the buffer and updated according to the following rules: if this symbol is the first non-terminating run symbol in the buffer and if the updating of this symbol terminates the run symbol, then this symbol and all of the following terminated symbols of other states are transmitted to the output encoder, creating empty locations in the buffer memory, or else this symbol is written back into the buffer in the same location if the symbol is not the first non-terminating run in the buffer, or when the updating of the symbol does not terminate it.

When new symbols are generated (terminated or non-terminated), they are stored into the buffer memory in the order in which they occur, starting from the first empty location in the buffer. Thus, all the new symbols generated in all states in subsequent lines are either used to update the non-terminating runs already stored in the buffer in the corresponding states, or they are stored in the buffer memory in sequential order in the empty locations until the buffer becomes full and cannot accommodate any new symbols in any state. At that time, the first non-terminating run symbol in the buffer is artificially terminated and transmitted, followed by all the terminated runs of other states, creating empty locations in the buffer which will be used to store the new symbols generated in subsequent lines. Thus, the buffer is used as a circulating first in-first out (FIFO) memory for read and write operations until all scan lines in the image have been processed and all symbols encoded and transmitted.

CBWRL symbols are generated in each source state, independently, from prediction error pixels of each scan line. The source state for each of the prediction error pixels is also generated. For the first scan line in the preferred embodiment, the first symbol generated is in the $S_0$ state and, depending on the color of the pixel, the first half of the CBWRL symbol is generated.

If the following pixel belongs to the same state as the first pixel and is of the same color, the first half of the same symbol is updated; however, if it is of the opposite color, the first half is terminated by that pixel and the second half is generated from the next pixel in that state. If the next pixel belongs to a different state, the symbol generated in the previous state is stored in the buffer with its color, state, and run termination information before a new symbol in a new state is generated.

If, after a few pixels, the state changes back to the original state, the previous symbol of that state (stored in the buffer), if not terminated, is updated until it becomes terminated, at which time the symbol is encoded; otherwise, a new symbol is generated in that state and stored in the next open location in buffer.

For every image, in each state, if the first symbol is a BW symbol, it must be preceded by a special symbol.

Figure 9:
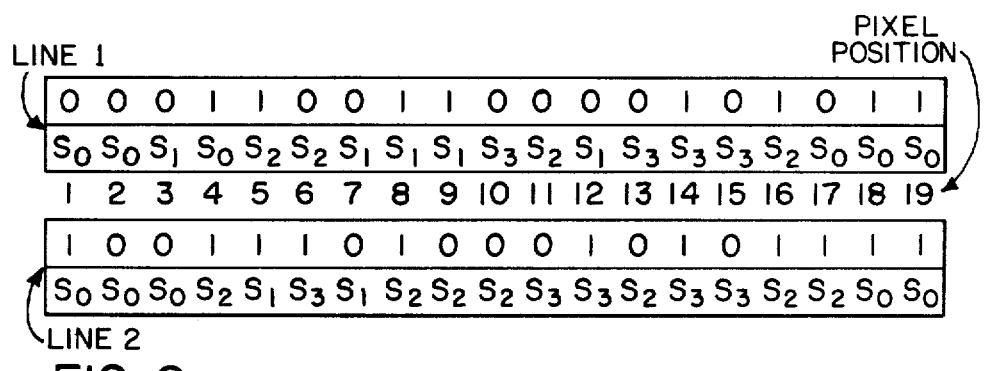
FIG. 9 shows a representation of two lines of data from the prediction error image.

FIG. 8 is a representation of two scan lines from a prediction error image along with the appropriate source states, which is used to illustrate the symbol generation method of the present invention, while FIG. 9 shows the contents of the buffer memory as these two scan lines are processed by the compression hardware.

Pixel 1 of line 1 of the prediction error image is a zero in the $S_0$ state. This pixel causes a WB symbol to be generated in the $S_0$ state. Therefore, the first available location in the buffer memory (0000) is loaded with the quantity 0000001000000000. Pixel 2 of line 1 is also a zero in the $S_0$ state, causing the current $S_0$ symbol which is stored in location 0000 of the buffer memory to be updated to 0000010000000000.

Pixel 3 of line 1 of the prediction error image is a zero in the $S_1$ state. Since this is the first pixel encountered in the $S_1$ state, a WB symbol is generated and stored in the next available location (0001) in the buffer memory. Thus, the quantity 0000001000000100 is written into that location.

Pixel 4 of line 1 of the image is a one in the $S_0$ state. Since there is a current non-terminated WB symbol stored in memory, this pixel terminates the white half run of that symbol, and memory location 0000 is updated to contain the quantity 0000010000000010.

Pixel 5 of line 1 is a one in the $S_0$ state. In the present invention, is it assumed that all initial symbols in each state are WB symbols; therefore, a special symbol must be generated in the $S_2$ state preceding the BW symbol to be generated using this pixel. The special symbol, which is a terminated symbol, is stored in the next available location (0010) in memory as the quantity 0000000000001001, while the BW symbol for state $S_2$ is stored in location 0011 as the quantity 0000000000111010. The special symbol, although terminated, is not transmitted, since it is preceded by non-terminated symbols in states $S_0$ and $S_1$ in the buffer. Pixel 6 of line 1 is also in the $S_2$ state, but has a value of zero. This pixel terminates the black half run of the BW symbol in the $S_2$ state, and updates the quantity stored in location 0011 to 0000000001111000.

Pixel 7 in the first line of the prediction error image is a zero in the $S_1$ state. This pixel updates the current $S_1$ symbol, which is stored in location 0001 of the buffer memory, to the value of 0000001000000100. The following two pixels 8 and 9 are also contained in the $S_1$ state, but have the value of one. The first of these pixels terminates the white half run of the current WB symbol, while the second pixel updates the black half run, causing the quantity stored in location 0001 to become 0000010010010110.

Pixel 10 of line 1 is a zero in the $S_3$ state. This is the initial pixel in that state; therefore, a WB symbol is generated in the $S_3$ state by this pixel and the quantity 00000010001100 is stored in the next available memory location (0100) in the buffer.

Pixel 11 is a zero in the $S_2$ state, which updates the white half of the current BW symbol stored in location 0011 to the quantity 00000100111000.

The next pixel, pixel 12, is a zero in the $S_1$ state, which causes a change in color of the current WB run length. Thus, this pixel causes the $S_1$ information currently stored in location 0001 to be terminated (00000100100111), which data represents a (2,1) run length in the $S_1$ state. This terminated symbol, however, cannot be transmitted to the encoder until symbols in all states in the preceding memory locations are also terminated. Thus, this symbol will not be transmitted until the $S_0$ symbol in location 0000 is terminated.

In addition, pixel 12 also begins a new WB symbol in the $S_1$ state, which is loaded into the next available memory location (0101) in the buffer as the quantity 00000010000100.

The next three pixels 13, 14 and 15 in the first line of the prediction error image all belong to the $S_3$ state. The first, which is a zero, updates the contents of the WB symbol in the $S_3$ state stored in location 0100 to 00000100001100. The second, which is a one, terminates the white half of the WB symbol and updates the contents of the memory to 00000100001110. The third, which is a zero, causes the current WB symbol to be terminated, and is stored in the next available memory location (0110) as a new symbol with the quantity 00000010001100. The terminated WB symbol in location 0100 (with a value of 00000100001111) represents a (2,0) run length, and cannot be transmitted until all symbols preceding it have been terminated and transmitted.

Pixel 16 of line 1 is a one in the $S_2$ state. This pixel represents a change in the working color in the current BW symbol, terminating the current symbol which is stored in the 0011 location with the value of 00000100111001. A new BW symbol is begun in the next available memory location (0111), into which the quantity 00000000111010 is loaded.

The final three pixels 17, 18 and 19 in the first line are all contained in the $S_0$ state. The first of the three is a zero which represents a change in working color in the current WB symbol, terminating the current $S_0$ symbol stored in location 0000, and transmitting the contents (00000100000011) representing a (2,0) run length to the encoding hardware. When this symbol has been transmitted, the terminated symbols stored in locations 0001 ($S_1$), 0010 ($S_2$) (Special Symbol), 0011 ($S_2$), and 0100 ($S_3$) may also be transmitted in their order of occurrence.

In addition, a new WB symbol is started by this pixel in state $S_0$, and it is stored in the next open location (1000) in the memory buffer as a value of 00000100000000.

The second of the three $S_0$ pixels is a one, which terminates the white half of the WB run symbol stored in location 1000, updating its value to 00000100000010. The third pixel in the $S_0$ state (which is the last pixel contained in line 1) is also a one, and updates the value of the symbol stored in location 1000 to 00000010100010.

The method described in the present embodiment is continuous from line-to-line; therefore, pixel 1 in the line 2 of the prediction error image, which is a one in the $S_0$ state, is used to update the current $S_0$ symbol stored in location 1000 to a value of 00000011000010.

Pixels 2 and 3 in line 2 are also contained in the $S_0$ state, but both have a value of zero. The first of these pixels terminates the current WB run symbol at a run length of (1,2) stored in location 1000, and the quantity stored at this location (00000011000011) is to be transmitted when the preceding symbols in the buffer are terminated. A new $S_0$ is started by this pixel and stored in location 1001 of the buffer with a value of 00000010000000. The second of these $S_0$ state pixels updates the current symbol in location 1001 to a value of 00000100000000.

The next pixel, pixel 4, in line 2 is a one in the $S_2$ state, which updates the current BW symbol stored in location 0111 to a value of 00000001011010.

Pixel 5 in the line 2 is a one in the $S_1$ state. This pixel terminates the white half run of the current WB symbol stored in location 0101 and updates the value to 00000010000110.

The next pixel in line 2, pixel 6, is a one in the $S_3$ state, which terminates the white half of the current WB run stored in location 0110, and updates the value stored at that location to 00000010001110.

Pixel 7 in line 2 is a zero in the $S_1$ state, which terminates the current WB run symbol at a run length of (1,0) in location 0101 of the buffer memory at a value of 00000010000111, and transmits the contents of that location to the encoder, since it is not preceded by any unterminated symbols. The pixel is then used to start a new WB symbol in the $S_1$ state and stored in the next available location (1010) in buffer, storing the quantity 00000010000100.

The next three pixels 8, 9, and 10 in line two are all contained in the $S_2$ state. The first, having a value of one, updates the current $S_2$ symbol stored in location 0111 to a value of 00000001111010. The second, having a value of zero, terminates the black half run of the BW symbol, and updates the contents of location 0111 to 00000001111000. The third, also having a value of zero, updates the $S_2$ symbol to a value of 00000101111000.

The next two pixels 11 and 12 in line 2 are both contained in the $S_3$ state. The first, having a value of zero, terminates the current WB symbol at a run length of (1,0) in location 0110 of the buffer, and the quantity 00000010001111 is transmitted directly to the encoder, since there are no unterminated run symbols preceding this location. This pixel also begins a new WB symbol in the $S_3$ state in the next available memory location (1011), entering the quantity 00000010001100. The second of the two pixels, having a value of one, terminates the white half of the current $S_3$ symbol, and updates the quantity stored in location 1011 to 00000010001110.

Pixel 13 in the line 2 is a zero in the $S_2$ state. This pixel updates the value of the BW symbol stored in location 0111 to 00001001111000.

The next two pixels 14 and 15 in line 2 are both contained in the $S_3$ state. The first has a value of one, which updates the WB symbol stored in location 1011 to a value of 00000010101110. The second has a value of zero, terminating the WB symbol stored at location 1011 at a run length of (1,1) with a value of 00000010101111. The contents of location 1011, however, cannot be transmitted to the encoder until the symbols stored in locations 0111, 1001, and 1010 are terminated. This pixel is then used to begin a new WB symbol in the S$_3$ state, and is stored in location 1100 with a value of 00000010001100.

The next two pixels 16 and 17 in the second prediction error image line are both ones in the S$_2$ state. Since the current S$_2$ symbol is a BW symbol which has a working color of white, the current symbol, stored in location 0111, is terminated at a run length of (3,2), and the symbol, with a value of 00001001111001, is transmitted to the encoder. In addition, the S$_0$ symbol in location 1000 can now be transmitted. The two pixels 16 and 17 are then stored in the next available location (1101) in the buffer with a value of 00000001011010.

The final two pixels 18 and 19 in the second line are both ones in the S$_0$ state. The first terminates the white half of the WB run in the current S$_0$ symbol stored in location 1001, and, together with the second updates the symbol stored in location 1001 to a value of 00000100100010. Thus, the symbol in location 1011 cannot be transmitted until symbols in locations 1001 and 1010 become terminated from pixels of the next scan line. However, if line 2 is the last line of the image, then all non-terminated runs are treated as terminated and hence are transmitted.

Figure 11:
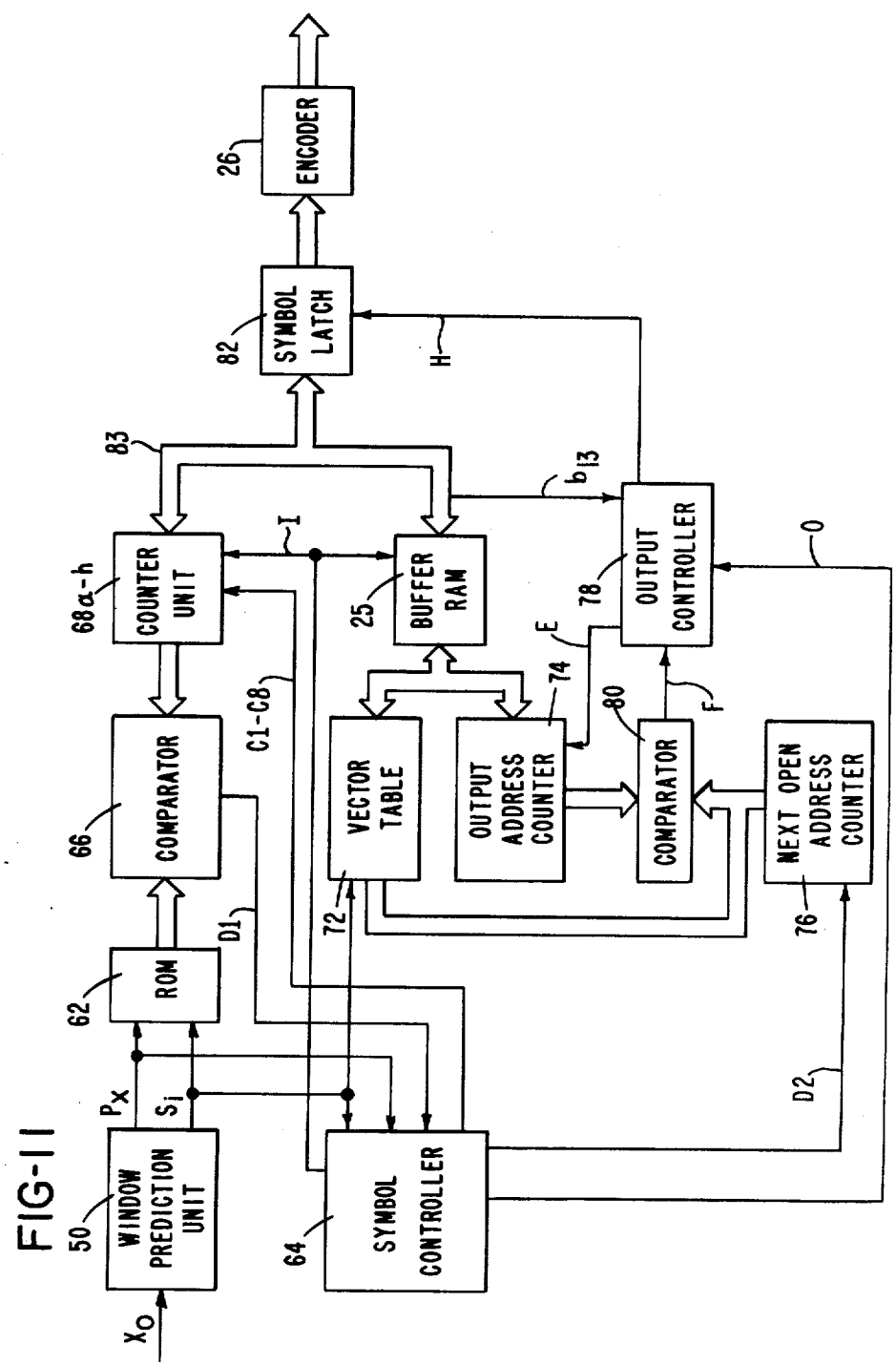
FIG. 11 shows the circuitry for the compressor hardware used in the present embodiment.

Referring now to FIG. 11, a detailed embodiment of the compressor 12 hardware is shown. The preprocessed image data from the image processor 10 (FIG. 1) is transmitted serially to a window prediction unit 50. Window prediction unit 50 is shown in greater detail in FIG. 12.

In operation, the window prediction unit 50 starts from the upper right corner of the document image to be compressed, as was shown in detail in FIG. 5. In each scan line, the window is moved down one pixel position and the prediction error pixel and its corresponding source state are generated for that window position using the prediction and source state tables, respectively. This procedure is repeated until the end of the scan line is reached. At that time, the window is moved to the beginning of the next scan line located one pixel to the left of the current scan line, and the procedure is repeated until the complete image has been processed.

Due to the shape of the window used in window prediction unit 50, prediction is undefined for a region including the first three scan lines of the document and the top and bottom two pixels in each scan line. This region corresponds to the pixel positions of the document where an element of the window falls outside of the image. The output of prediction window unit 50 is forced to a predicted value of zero in source state S$_0$ for all pixels within this undefined region, causing the output of unit 50, which is the prediction error pixel P$_X$, to be the actual value X$_0$ of the pixel to be predicted, and is contained in source state S$_0$.

Figure 12:
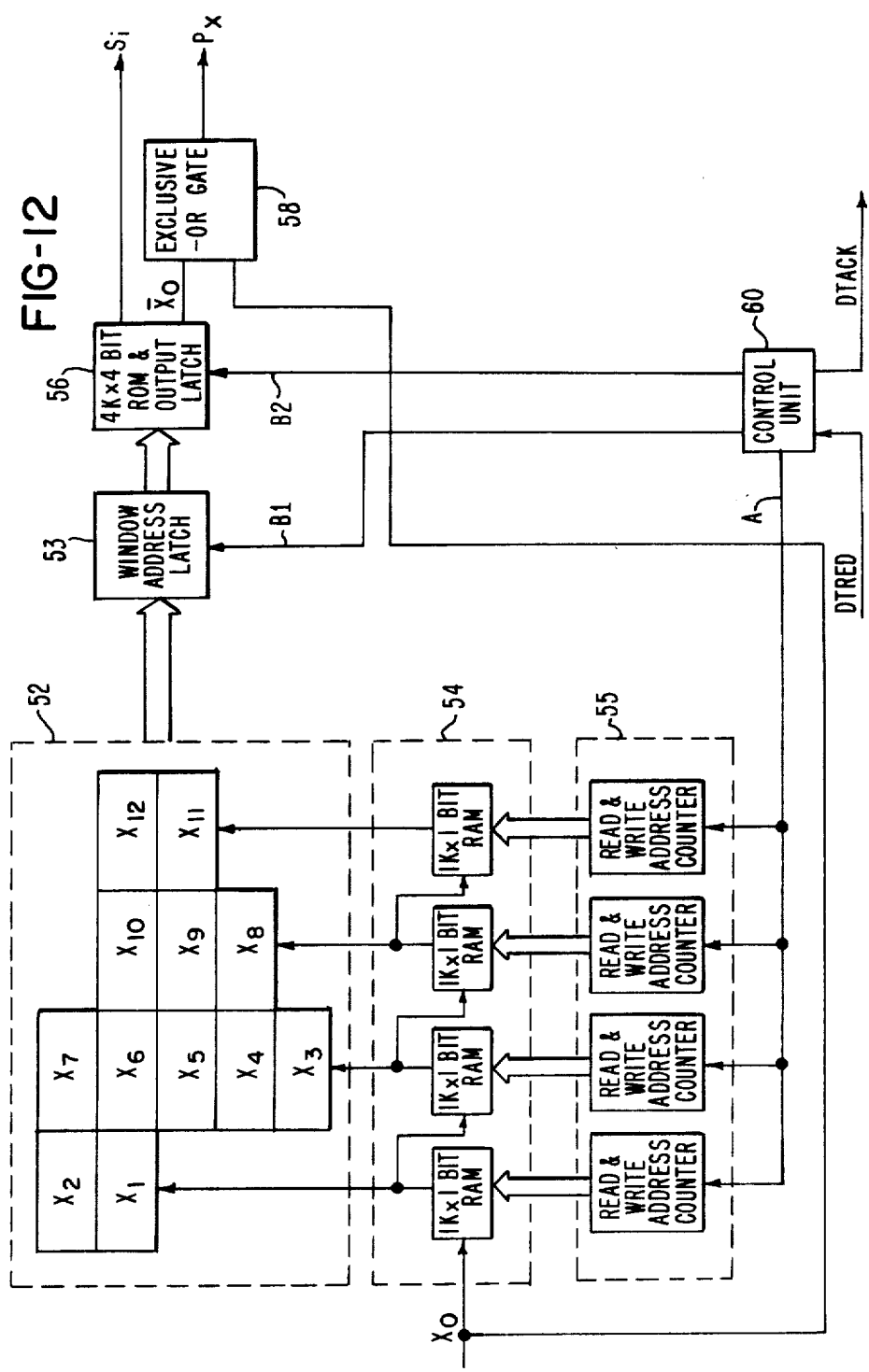
FIG. 12 shows the circuitry for the window prediction unit used in the present embodiment.

Referring now to FIG. 12, the actual pixel X$_0$ obtained from image processor 10 (FIG. 1) is transmitted to the window predictor 52 via a storage RAM unit 54 and address counter unit 55. Unit 54 consists of four 1K×1 bit RAM buffers and stores the three previous scan lines and the current line obtained during the processing of the document image. Unit 55 contains several Read and Write address counters 55a-d for the four 1K×1 bit RAMs, to continuously provide window predictor 52 with the pixels from the previous three scan lines and the current scan lines which are in the correct relationship with the actual pixel X$_0$ with respect to the digitized image.

The twelve pixels X$_1$-X$_{12}$ which comprise window predictor 52 are transmitted to a ROM 56 via a window address latch 53. Stored within ROM 56, which is a 4K×4 bit device, are the one bit prediction and two bit source state tables for all possible input combinations (states) of window predictor 52. ROM 56 generates a predicted pixel value $\overline{X_0}$ and a source state S$_i$ for the current pixel X$_0$ to be predicted, based on the configuration of previously scanned pixels X$_1$-X$_{12}$ of window predictor 52. This predicted pixel value $\overline{X_0}$ is transmitted to an EXCLUSIVE-OR gate 58, which gate compares the predicted pixel X$_0$ to the actual pixel value $\overline{X_0}$ to generate the prediction error pixel P$_X$.

A control unit 60 transmits a signal A to counter unit 55 to enable the counters of unit 55 to update the data contained in the window predictor 52 to the next pixel position as each current pixel is received. Control unit 60 transmits a signal B1 to address latch 53 to generate an address for ROM 56, then transmits a signal B2 to enable ROM 56, outputting the predicted pixel value $\overline{X_0}$ and source state S$_i$ for the given window predictor data arrangement. $\overline{X_0}$ is combined with the original pixel X$_0$ via EXCLUSIVE-OR gate 58, generating P$_X$. Control unit 60 also communicates with image processor 10 (FIG. 1) via signals DTRED and DTACK to receive data available from processor 10 and to acknowledge to processor 10 that data has been received.

Referring again to FIG. 11, the prediction error pixel P$_x$ and the source state S$_i$ are transmitted to a ROM 62 and also to a symbol controller 64. Controller 64, a field programmable logic array (FPLA) chip, provides the timing and control signals used to generate the run symbols sent to the encoding hardware. The FPLA can be programmed such that a desired signal is outputted from the chip in response to a sequence of signal inputs to the chip, as is well-known in the art. ROM 62 stores the maximum run length information for each color in all source states; thus, eight locations may be addressed in ROM 62 using the color and source state information conveyed by P$_x$ and S$_i$ for prediction error pixels. The output of ROM 62 is coupled to one set of inputs of a comparator unit 66, whose second set of inputs are connected to a counter unit 68. Counter unit 68 contains eight counters, 68a-h, for generating run lengths of prediction error pixels for each color in all four source states.

As each prediction error pixel P$_x$ and source state S$_i$ is received by ROM 62, the corresponding maximum length is outputted to comparator 66. Concurrently, controller 64 updates the contents of the appropriate counter in unit 68 for the received pixel via the proper signal from a set of signals C1-C8 in the current source state. The contents of the appropriate counter is then compared to the maximum run length information obtained from ROM 62 by comparator 66. If there is coincidence, the run length of that color in that state has attained its maximum allowable length and hence is terminated; a new run length is then generated in that state. A signal D1 is transmitted from comparator 66 to controller 64 to indicate this coincidence.

The actual run symbols are assembled and stored in a buffer RAM 25 (FIG. 2) in the same order in which they occur, in the manner which was previously described in detail with respect to FIG. 10. The addresses of RAM buffer 25 in which non-terminated symbols are stored are stored in a vector table 72. The addressing of RAM 25 is accomplished either via vector table 72 (for WRITE addressing) or via an address counter 74 (for READ addressing). Vector table 72, which is contained in a register file integrated circuit device, stores the RAM 25 address of the current non-terminated symbol for each of the four source states and is enabled by the current source state $S_i$. The available addresses for the current symbols are loaded into vector table 72 by an address counter 76. Counter 76, which is incremented by a control signal D2 from symbol controller 64, always contains the address for the next open location in the buffer RAM 25. As a symbol is terminated in a state, counter 76 loads the next open address into vector table 72 as the address for the new symbol to be generated in that state.

RAM 25 also may be addressed by counter 74, which stores the address of the location in RAM 25 which contains the next symbol to be outputted to encoder 26. Counter 74 is controlled by a signal E from an output controller 78. Controller 78, a field programmable logic array (FPLA) chip, provides the timing and control signals for outputting terminated run synbols to the encoding section of compressor 12 (FIG. 1). When RAM 25 outputs a symbol to be encoded, signal E increments counter 74 to obtain the address of the next symbol to be outputted.

The contents of counters 74 and 76 are also transmitted to a comparator 80. When comparator 80 senses that the contents of both counters 74 and 76 are equal, signifying that the next open (WRITE) address is equal to the next output (READ) address (indicating that RAM 25 is empty), a signal F is transmitted to output controller 78. Signal F indicates one of two things: if the contents of (READ) address counter 74 become equal to the contents of (WRITE) address counter 76, it means that all of the symbols stored in RAM 25 have been transmitted, implying that the end of the image has been encountered, and disabling further operation of output controller 78; or, if the contents of counter 76 become equal to the contents of counter 74, it means that all the locations in RAM 25 are full, and the first unterminated symbol pointed by the address counter 74 must be artificially terminated and transmitted so that counters 74 and 76 can be updated.

Counter unit 68 and RAM 25 are connected to a symbol latch 82 via a data bus 83. One bit from data bus 83, labeled $b_{13}$, is transmitted to output controller 78. Bit $b_{13}$ indicates to controller 78 that there is a terminated symbol on bus 83. When bit $b_{13}$ is active (high), output controller 78 transmits a signal H to latch 82, causing the data on bus 83 to be captured. The captured data is then transmitted as an address to encoder 26, which transmits the encoded data over medium 14 (FIG. 1) to the decompressor 16 (FIG. 1).

Figure 13:
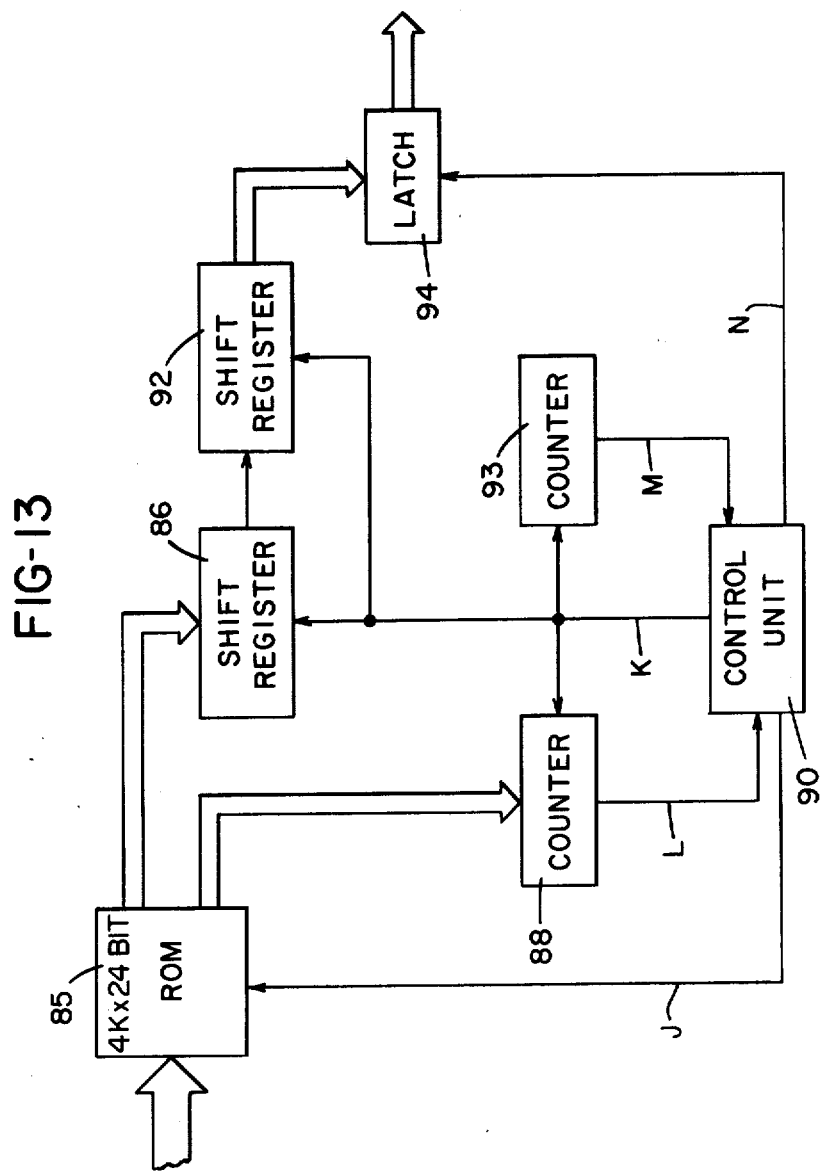
FIG. 13 shows the circuitry for the encoder hardware used in the present embodiment.

A detailed diagram of encoder 26 is shown in FIG. 13. The data from latch 82 (FIG. 11) is transmitted to a ROM 85. ROM 85, a 4K × 24 bit memory device, stores the variable length code words corresponding to the WB and BW run symbols generated from the image in all four states, and is enabled by a signal J from a control unit 90. The twenty-four bit output of ROM 85 consist of a nineteen bit code word and a five bit code length. The first nineteen bits are transmitted to a shift register 86. However, since the code words are variable in length, not all of the nineteen bits will represent the code word. Therefore, the last five bits of the output of ROM 85, which represent the length of the code word, are used to specify the number of bits actually to be shifted out from the nineteen bit ROM output to form the code word. These five bits are transmitted to a counter 88. Counter 88, a five bit down counter, is clocked by a signal K from control unit 90, which signal also clocks shift register 86. Each time that signal K clocks shift register 86, which is a parallel in-serial out device, the contents of counter 88 (representing the number of bits in the code word) is decremented by one and shift register 86 outputs one bit of data to an eight bit shift register 92, a serial in-parallel out device which is also clocked by signal K. When counter 88 is clocked to zero, a signal L is transmitted to control unit 90, signifying that the complete code word stored in shift register 86 has been outputted to shift register 92.

Signal K is also transmitted to a three bit up counter 93. Counter 93 is clocked by signal K until it receives eight pulses, at which time it transmits a signal M to control unit 90, signifying that an eight bit byte of encoded data is contained in shift register 92. Control unit 90 then transmits a signal N to a latch 94, outputting the eight bit byte of encoded data over transmission medium 14 to the decompressor 16.

Referring again to FIG. 11, a more detailed description of the operation of compressor 12 (FIG. 1) is now supplied. As each original pixel $X_0$ enters window prediction unit 50, a one bit predicted pixel $P_x$ and its corresponding two bit source state $S_i$ are outputted to symbol controller 64, and also are used to address the maximum length ROM 62. The maximum length corresponding to the current source state and color is then transmitted to comparator 66.

Controller 64 outputs one of signals C1-C8 to counter unit 68 to increment the proper counter (representing the length of the run) corresponding to the current working color (bit $b_{12}$) and source state. Counter unit 68, comprised of eight counters 68a-h, has one counter for each color in each of the four source states. One of signals C1-C8 increment the appropriate counter for each pixel of the same color in the same source state. In operation, when controller 64 receives a pixel from a different source state than the previous state, the contents of the two counters comprising the complete run symbol in the previous source state are transmitted via data bus 83 to RAM 25, where the symbol stored in a location in memory in which the address (WRITE) is found in vector table 72 for that source state. Vector table 72 contains an address for the current memory location of RAM 25 for each of the four source states. The addresses of open (empty) locations in RAM 25 for storage of subsequent symbols are supplied to vector table 72 by counter 76.

When one of the counters in counter unit 68 has equalled the maximum run length value obtained from ROM 62 for the appropriate color and source state, comparator 66 transmits signal D1 to controller 64. If the next pixel in that source state is the same color, then, depending on the type of run length presently being generated, several possible alternatives occur.

If the type of run presently being generated is the first half of a run length, such as the black half of a BW run length, the data contained in the current counter, which data comprises the maximum run length, is transmitted to RAM 25 along with the empty contents of the counter representing the remaining color (half run) in that source state. For example, if counter unit 68 reaches seven in the $S_0$ state while generating a BW run symbol, and the next pixel transmitted to controller 64 is a one in the $S_0$ state, controller 64 transmits a signal I to counter unit 68 and RAM 25, transferring the run symbol (7,0) to RAM 25 (zero for the white half since the second half of the BW run symbol is empty until the first half is terminated) and bit $b_{13}$ of data bus 83 is activated, alerting controller 78 that a terminated symbol has been loaded into RAM 25. The current counter in unit 68 is cleared, and controller 64 then transmits the appropriate signal C1-C8 to the counter responsible for the black half of the $S_0$ source state to begin a new BW run.

However, if the type of run presently being generated is the second half of a run length, such as the black half of a WB run, when the maximum length is reached and the next pixel is a one, then this symbol must be terminated and a special symbol generated to switch the type of run. For example, if counter unit 68 reaches three in the $S_0$ state while generating the black half of a WB run symbol and the next pixel transmitted to controller 64 is a one in the $S_0$ state, controller 64 transmits signal I to counter unit 68 and RAM 25, which signal causes the transfer of the run symbol (X,3), where X is the number of white pixels contained in the white half run of the WB symbol, to RAM 25 as a terminated symbol, while the current counter in unit 68 is cleared. Then controller 64 again transmits signal I to counter unit 68 and RAM 25, causing a terminated symbol with the value of (0,0) in source state $S_0$ to be stored in RAM 25 in the location immediately following the (X,3) run symbol. This (0,0) run symbol represents the special symbol, which symbol indicates that the type of run symbol currently being generated in that particular source state is switching to the opposite type, such as from a WB run symbol to a BW run symbol, as shown in the present example. The black half of the new BW symbol is then begun in counter unit 68 with the current pixel, a one in the $S_0$ source state.

Output controller 78 is responsible for transferring terminated run symbols from RAM 25 to encoder 26. This operation is initiated by a signal O from symbol controller 64. The output memory (READ) address counter 74 contains the address of the next symbol in RAM 25 to be sent to encoder 26. Upon receiving signal O from controller 64, output controller 78 causes the quantity stored in counter 74 to address RAM 25. Output controller 78 then examines the termination bit $b_{13}$ of data bus 83 from the output of RAM 25. When the value of this bit is one (active), it signifies that the symbol stored at that location in memory is terminated and ready to be transmitted to encoder 84. Output controller 78 then transmits signal H to enable latch 82, capturing the terminated symbol and transmitting that symbol to encoder 26 for transmission of the encoded data over medium 14 (FIG. 1).

Output controller 78 then transmits signal E which increments counter 74 to the next location. The corresponding output of RAM 25 on data bus 83 is then examined for the value of termination bit $b_{13}$. If it is equal to one, the symbol data on bus 83 is sent to encoder 84. This procedure is followed until the output of RAM 25 contains a termination bit on $b_{13}$ with the value of zero, which means that an unterminated symbol has been encountered in the buffer and the outputting of symbols is temporarily halted until this symbol becomes terminated. However, if the contents of counter 76 becomes equal to the contents of counter 74, comparator 80 transmits signal F to controller 78, signifying that the buffer is full and there are no empty memory locations for storing new symbols. In this event, the unterminated symbol must be artificially terminated and transmitted to encoder 26, and counters 74 and 76 updated.

If, during this operation, the contents of counter 74 becomes equal to the contents of counter 76, comparator 80 transmits signal F to output controller 78, signifying that all the symbols which were stored in RAM 25 have been transmitted to encoder 26, implying that the end of the image has been reached.

Referring now to FIG. 14, there is shown a detailed embodiment of the decompressor 16 hardware. The byte of data is received from transmission medium 14 (FIG. 1) by shift register 28. Shift register 28, a parallel in-serial out device, receives the eight bits of data in parallel from transmission medium 14. Each bit of data in shift register 28 is clocked out serially by a signal P from an input controller 102. Controller 102, a FPLA device, provides the timing and control signals for controlling data entry to decompressor 16.

The serial output from shift register 28 is transmitted bit by bit to a ROM 104 in response to signal P from controller 102. ROM 104 contains the actual BW and WB run lengths corresponding to the variable length code words which are outputted from the encoding unit 26 (FIG. 2). In the present embodiment, ROM 104 actually contains a group of memory tables, one for each source state and color; each source state uses a different table to decode its run lengths. Since, in the preferred embodiment, there are four states and two types of symbols in each state, decoder ROM 104 contains eight look-up tables, with each table containing 1024 bits. Thus, ROM 104 is an 8K × 16 bit ROM having a thirteen bit address $A_0$-$A_{12}$ and a thirteen bit output $B_0$-$B_{12}$, and is enabled by a signal Q1 from controller 102. The decoding operation requires a serial data input $A_0$ supplied by shift register 28 and, for each input bit, a thirteen bit address is generated and applied to ROM 104, and its output is then examined. The remaining twelve input address bits $A_1$-$A_{12}$ are obtained from the outputs of two data latches 106 and 108.

The $A_1$-$A_9$ address bits are obtained by feeding back output bits $B_0$-$B_8$ to the input of ROM 104 via latch 106, which latch is enabled by a signal Q2 from controller 102. The $A_{10}$ bit, which represents the current color bit, and the $A_{11}$ and $A_{12}$ bits, which represent the current source state, are obtained from the output of latch 108, which latch is enabled by a signal R from controller 102.

The thirteen bit output $B_0$-$B_{12}$ of ROM 104, which is transmitted to latch 106 and also to a latch 110, is used for generating addresses for ROM 104 and also for generating symbols, depending on the value of the bit $B_{12}$. If $B_{12}$ is a one, then bits $B_0$-$B_8$ are used as part of the next address ($A_1$-$A_9$) to ROM 104, while when $B_{12}$ is a zero, bits $B_0$-$B_8$ represent a valid symbol. When a valid symbol is detected, bit $B_9$ of the thirteen bit output represents the color of the current decoded symbol, with zero representing a WB symbol and one representing a BW symbol. Bits $B_{10}$-$B_{11}$ represent the source state of the decoded symbol, where 00 represents the $S_0$ state, 01 represents the $S_1$ state, 10 represents the $S_2$ state, and 11 represents the $S_3$ state.

When decoding a special symbol, bits $B_0$-$B_8$ are all equal to zero, bit $B_9$ represents the color of the next symbol to be decoded, bit $B_{10}$ is always equal to one, and bits $B_{11}$-$B_{12}$ represent the source state of the next symbol to be decoded.

The decoding of a valid symbol, in any state and in any color, will now be described with reference to FIG.

14. For each input bit from shift register 28, a thirteen bit address is generated as described above and applied to ROM 104, and the output is examined. If the value of output bit $B_{12}$ is equal to zero, which indicates that a valid symbol has been decoded in the source state represented by output bits $B_{10}$-$B_{11}$ and in the color (WB or BW) represented by output bit $B_9$, then the output bits $B_0$-$B_8$ (nine bit symbol) are latched into latch 110 by a signal S from controller 102 as a symbol to be decompressed. The color and source state of that symbol (bit $B_9$ and bits $B_{10}$-$B_{11}$) are also latched into latch 110, to enable the two half runs of the nine bit symbol to be loaded into the appropriate counters for decompression.

If, however, the value of output bit $B_{12}$ is equal to one, then bits $B_0$-$B_8$ belong to a node address (indicating that symbol decoding requires more serial input bits) and hence bits $B_0$-$B_8$ of the ROM 104 output are transmitted via latch 106 back to the input of ROM 104 as bits $A_1$-$A_9$ of the ROM 104 address. These nine bits are combined with next input bit $A_0$ from shift register 28 and color and source state bits $A_{10}$, $A_{11}$-$A_{12}$ from latch 108 to generate a new thirteen bit Address ($A_0$-$A_{12}$) for the next ROM 104 address in order to decode a valid nine bit symbol in that state.

When a valid symbol has been captured in latch 110, it is then stored in a buffer RAM 112. RAM 112 is capable of storing one symbol in each of the four source states, enabling the decompression hardware to decode symbols from the data received from compressor 12 (FIG. 1) while simultaneously decompressing a valid symbol, which greatly reduces the overall decompression cycle. Storage in RAM 112 is accomplished as controller 102 transmits a signal T to the read control of RAM 112, causing the symbol captured in latch 110 to be stored in the location corresponding to its source state.

When a valid symbol is ready to be decompressed, controller 102 transmits a signal U to a clock control unit 116, which is an FPLA device. Controller 102 also transmits a signal V to the write control of RAM 112, which outputs symbol data (bits $B_0$-$B_{11}$) to a counter array 114. Counter array 114 consists of eight counters 114a-h, with a counter reserved for each color in each state. The counter to be selected for loading in the nine bit symbol data (bits $B_0$-$B_8$) is determined by the color bit $B_9$ and the source state bits $B_{11}$-$B_{12}$ of the ROM 104 output. Each decoded nine bit symbol consists of two half run lengths, with one counter reserved for each half run length in each source state. The eight counters are arranged such that counter 114a is used for decompressing a white half run in the $S_0$ state; counter 114b is used for decompressing a black half run in the $S_0$ state; counter 114c is used for decompressing a white half run in the $S_1$ state; counter 114d is used for decompressing a black half run in the $S_1$ state; counter 114e is used for decompressing a white half run in the $S_2$ state; counter 114f is used for decompressing a black half run in the $S_2$ state; counter 114g is used for decompressing a white half run in the $S_3$ state; and counter 114h is used for decompressing a black half run in the $S_3$ state.

If the decoded symbol is a WB symbol in any source state, then the nine bit symbol consists of a seven bit (bits $B_0$-$B_6$) white half run (loaded into counters 114a, c, e, or g, depending on the state to which the decoded symbol belongs) and a two bit (bits $B_7$-$B_8$) black half run, (loaded into counters 114b, d, f, or h). However, if the decoded symbol is a BW symbol in any source state, then a six bit (bits $B_0$-$B_5$) white half run is loaded into counter 114a, c, e or g, (depending on the source state to which the decoded symbol belongs) and a three bit (bits $B_6$-$B_8$) black half run is loaded into the counter 114b, d, f or h. This loading operation is controlled by bits $B_9$-$B_{11}$ of the RAM 112 output and by a signal W from clock control unit 116. Then, after the symbol has been loaded into the appropriate counters, the first half run is decompressed, followed by the second half run of the symbol. As each prediction error pixel (of a color represented by the color of first half run) is outputted, it is transmitted to an EXCLUSIVE-OR gate 120, and the contents of the corresponding counter 114a-h is decremented by one by a signal X from control unit 116. If all the pixels represented by first half run are outputted, then the corresponding counter sends a signal Y to clock control unit 116 and it automatically switches to the appropriate counter 114 a-h to start decompressing pixels of second half run. When all pixels of the second half run have been outputted, that counter 114 a-h will now transmit signal Y to clock control unit 116, and if the source state still remains the same, then clock control unit 116 will transmit a signal Z to controller 102 indicating that a new symbol in that particular state should be sent from RAM 112. The clock control unit 116 will also clear the appropriate counter. Also, clock control unit 116 sends a signal AA to the output controller 126, which indicates that it is waiting for another symbol to be decoded to replace the last symbol in RAM 112. If, while decompressing any half run, in any source state, the source state changes, then the two bit source state and one bit color of new symbol, fed to clock control unit 116 from the ROM 118 source state table, will automatically switch counter array 114 to the appropriate counter of new source state and continue decompressing the remaining part of the half run contained on that counter. If the counter representing the new source state is empty, then clock control unit 116 will request input controller 102 to transfer a new symbol in that source state from RAM 112 to the appropriate counter in counter array 114. Signal BB from output controller 126 to clock control unit 116 serves as a handshaking signal between the two controllers.

As a symbol is being decompressed, each pixel is clocked out of counter array 114 and is combined with a predicted pixel $\overline{X_0}$ from a ROM 118 via EXCLUSIVE-OR gate 120. ROM 118 is a 4K×4 bit device which contains the identical prediction and source state tables as ROM 56 in FIG. 12. ROM 118 is addressed by a window predictor 122, the operation of which is identical to window predictor 52 previously described in FIG. 12. The four scan lines of reconstructed image data required by window predictor 122 are supplied by a storage RAM 124, and the movement of pixels from RAM 124 to window predictor 122 is controlled by a signal DD from an output controller 126, which is an FPLA device. RAM 124 consists of four 1K×1 bit RAMs with a set of read and write address counters, the operation of which is identical to units 54 and 55 described in FIG. 12. The operation of window predictor 122 (pixel-by-pixel along the scan and from scan-to-scan) is used to address ROM 118, which device is enabled by a signal EE from controller 126.

The output of EXCLUSIVE-OR gate 120, which is the decompressed original pixel $X_0$, is transmitted to the image data buffer 128, where it fills the reconstructed scan line of the facsimile image. This original pixel $X_0$ is also transmitted to storage RAM 124 to fill the current scan line for window predictor 122. The 12 bit window address from predictor 122 addresses ROM 118, which outputs the one bit predicted value, $\overline{X_0}$, for pixel $X_0$ to EXCLUSIVE-OR gate 120, and the two bit source state value $S_i$ to which pixel $X_0$ belongs. The source state $S_i$ is used to select the proper set of counters in counter array 114 from which the decoded symbols in that state are decompressed into original prediction error pixels of that state, $S_i$. This procedure is continued until all of the symbols from compressor 12 have been decoded, decompressed and reconstructed into a scan line for the facsimile image.

The decompressed pixels are transmitted to the image data buffer 128 on a pixel-by-pixel basis, and as the data enters buffer 128, each pixel is counted by a counter 130. The size of counter 130 is equal to the number of bits in one scan line of the original image. When counter 130 has counted to its maximum, it places the next pixel received by buffer 128 in a new scan line. Counter 130 then begins a new count, and this technique continues for all the data buffer 128 receives. In this manner, the decompressed image is reconstructed to appear exactly as the original image.

When the decompression process is complete, the decompressed image is transmitted to an output device 18, where it can be displayed on a CRT screen or printed on a hard copy unit.

While the invention has been shown and described in terms of a preferred embodiment thereof, it will be understood that this invention is not limited to this particular embodiment and that many changes and modifications may be made without departing from the true spirit and scope of the invention as defined in the appended claims.

I claim:

1. An apparatus for the processing of digital data derived from an image, comprising:
    first means for converting said digital data into varying run lengths of a first type data element and a second type data element;
    first receiving means for receiving said first and second types of data elements from said first conversion means, including first storage means for storing a specified number of data elements in a predefined pattern at any particular time;
    means for predicting for each original data element received from said conversion means the type of said data element based upon the types of data elements stored within said first storage means;
    means for classifying each of said predicted data elements into one of a plurality of source states, and providing a signal representative of said source state, wherein each source state is indicative of the degree of probability that said predicted data element is in error;
    first means for comparing each of said predicted data elements from said prediction means to its corresponding original data element from said first conversion means to generate a plurality of prediction error data elements, each of said prediction error data elements maintaining the same relationship to a given source state signal as its corresponding predicted data element;
    means for forming a plurality of symbols, wherein each symbol is comprised of a group of prediction error data elements having the same source state;
    first means for controlling the generation of said symbols by said formation means;
    second storage means, coupled to said formation means, for storing said symbols in the sequence in which they are generated by said formation means;
    third storage means, coupled to said second storage means, for storing a plurality of code words which are representative of each of said symbols contained in said second storage means;
    and means for outputting selected code words from said third storage means over a transmission medium, in response to receipt by said third storage means of symbols corresponding to said selected code words.

2. The apparatus of claim 1, wherein each of said symbols comprise a section of data representing a first type prediction error data element and a section of data representing a second type prediction error data element.

3. The apparatus of claim 1, wherein said first type data elements are black and said second type data elements are white.

4. The apparatus of claim 1, wherein said code words comprise variable length words.

5. The apparatus of claim 1, further comprising:
    second receiving means for receiving said code words from said transmission means;
    fourth storage means, coupled to said second receiving means, for storing a plurality of symbols which are representative of each of said code words, wherein each of said symbols is related to one of said source states;
    fifth storage means, coupled to said fourth storage means, for storing each symbol as it is generated from said fourth storage means;
    second means for controlling the generation of said symbols from said fourth storage means;
    second means for converting each of said symbols into a plurality of prediction error elements in one of said set of source states;
    sixth storage means for storing a specified number of data elements in a pre-defined pattern at any particular time;
    seventh storage means for storing a plurality of predicted data elements which are outputted in response to an address corresponding to a specific arrangement of data elements within said sixth storage means;
    eighth storage means for storing a plurality of source state elements which are outputted in response to an address corresponding to a specific arrangement of data elements within said sixth storage means;
    second means for comparing each predicted data element outputted from said seventh storage means to its corresponding prediction error data element outputted from said second conversion means, to produce a facsimile data element;
    and third means for converting said facsimile data elements into a digital image.

6. The apparatus of claim 1, wherein said predicting means comprises a read only memory device containing a plurality of predicted data elements which were pre-generated based upon prior analysis of a plurality of images similar in nature to the image to be digitized.

7. The apparatus of claim 1, wherein said classifying means comprises a read only memory device containing a plurality of source state elements which were pre-generated based upon prior analysis of a plurality of images similar in nature to the image to be digitized.

8. The apparatus of claim 1, wherein said plurality of source states comprises four source states $S_0$, $S_1$, $S_2$ and $S_3$.

9. The apparatus of claim 8, wherein source state $S_0$ contains those prediction error data elements for which the probability that the prediction is in error is less than or equal to 0.025.

10. The apparatus of claim 8, wherein source state $S_1$ contains those prediction error data elements for which the probability that the prediction is in error is greater than 0.025 but less than or equal to 0.050.

11. The apparatus of claim 8, wherein source state $S_2$ contains those prediction error data elements for which the probability that the prediction is in error is greater than 0.050 but less than or equal to 0.075.

12. The apparatus of claim 8, wherein source state $S_3$ contains those prediction error data elements for which the probability that the prediction is in error is greater than 0.075.

13. An apparatus for the processing of digital data from an image, comprising:
 means for converting said digital data into varying run lengths of a first type data element and a second type data element;
 first receiving means for receiving from said conversion means a serial stream of said first and second types of data elements, including first storage means for storing a specified number of data elements in a pre-defined pattern at any particular time;
 second storage means, coupled to said first storage means, for storing a plurality of predicted data elements which are outputted in response to a first address corresponding to a specific arrangement of data elements within said first storage means;
 third storage means, coupled to said first storage means, for storing a plurality of source state elements, each of which comprises one of a set of source states, which are outputted in response to said first address corresponding to said specific arrangement of data elements within said first storage means, and which are indicative of the degree of probability that a predicted data element is in error;
 first comparison means, coupled to said conversion means and said second storage means, for comparing each of said predicted data elements from said second storage means to its corresponding original data element from said conversion means to generate a plurality of prediction error data elements, each of said prediction error data elements maintaining the same relationship to a given source state element as its corresponding predicted data element;
 first control means, coupled to said first comparison means, and responsive to each prediction error data element and its corresponding source state, for generating a set of first signals;
 first counter means, responsive to said set of first signals, for counting said prediction error data elements received by said first control means according to type and source state;
 memory means, coupled to said first counter means, for arranging said prediction error data elements into a plurality of groups in each of said source states, said groups constituting digital symbols representative of each group;
 first addressing means for producing an address to said memory means in order that said symbols may be stored in said memory means according to the sequential order of occurrence of said source states;
 fourth storage means coupled to said memory means, for storing a plurality of code words which are representative of each of said symbols;
 second control means, coupled to said fourth storage means, for causing the outputting of selected code words from said fourth storage means;
 and means for outputting said selected code words from said fourth storage means over a transmission medium.

14. The apparatus of claim 13 wherein each of said symbols comprise a section of data representing a first type prediction error element and a section of data representing a second type prediction error data element.

15. The apparatus of claim 13 wherein said first type of data elements are black and said second type of data elements are white.

16. The apparatus of claim 13, wherein said second storage means comprises a read only memory device containing a plurality of predicted data elements which were pre-generated based upon prior analysis of a plurality of images similar to the image to be digitized.

17. The apparatus of claim 13, wherein said third storage means comprises a read only memory device containing a plurality of source state elements which were pre-generated based upon prior analysis of a plurality of images similar to the image to be digitized.

18. The apparatus of claim 13, wherein said first and second control means each comprise a field programmable logic array device.

19. The apparatus of claim 13 wherein said set of source states comprises four source states $S_0$, $S_1$, $S_2$ and $S_3$.

20. The apparatus of claim 19 wherein source state $S_0$ contains those prediction error data elements for which the probability that the prediction is in error is less than or equal to 0.025.

21. The apparatus of claim 19 wherein source state $S_1$ contains those prediction error data elements for which the probability that the prediction is in error is greater than 0.025 but less than or equal to 0.050.

22. The apparatus of claim 19 wherein said source state $S_2$ contains those prediction error elements for which the probability that the prediction is in error is greater than 0.050 but less than or equal to 0.075.

23. The apparatus of claim 19 wherein said source state $S_3$ contains those prediction error elements for which the probability that the prediction is in error is greater than 0.075.

24. The apparatus of claim 13 wherein said first addressing means includes fifth storage means for storing a first sequence of addresses for said memory means.

25. The apparatus of claim 24 wherein said fifth storage means comprises a register file integrated circuit device which is enabled by one of said source state elements.

26. The apparatus of claim 24 wherein said first addressing means further includes second counter means for producing a second sequence of addresses for said memory means.

27. The apparatus of claim 26 wherein said first addressing means further includes third counter means for supplying the location of the next open address in said memory means to said fifth storage means.

28. The apparatus of claim 26, further comprising:
second receiving means for receiving said code words from said transmission medium;
fifth storage means, coupled to said second receiving means, for storing a plurality of symbols which are representative of each of said code words, wherein each of said symbols is related to one of said source states;
sixth storage means, coupled to said fifth storage means, for storing each symbol as it is generated from said fifth storage means;
counter means, coupled to said sixth storage means, for converting each of said symbols into a plurality of prediction error elements in one of said set of source states;
seventh storage means for storing a specified number of data elements in a pre-defined pattern at any particular time;
eighth storage means, coupled to said seventh storage means, for storing a plurality of predicted data elements which are outputted in response to a second address corresponding to a specific arrangement of data elements within said seventh storage means;
ninth storage means, coupled to said seventh storage means, for storing a plurality of source state elements which are outputted in response to a second address corresponding to a specific arrangement of data elements within said seventh storage means;
second comparison means for comparing each predicted data element outputted from said eighth storage means to its coresponding prediction error data element outputted from said counter means to produce a facsimile data element;
and means for converting said facsimile data elements into a digital image.

29. A method for processing digital data from an image, comprising the steps of:
(a) converting said digital data into varying run lengths of a first type data element and a second type data element;
(b) receiving a continuous stream of said digital data and storing said data in a first storage means, which first storage means stores a specific number of data elements in a predefined pattern at any particular time;
(c) generating a predicted data element and a corresponding source state element, which source state element represents one of a set of source states for each original data element received from said image, where said predicted data element reflects the probable type of data element from the image with respect to a specific arrangement of other data elements within said storage means, and said source state element reflects the degree of probability that said corresponding predicted data element is in error;
(d) comparing each predicted data element to its corresponding original data element from said image to generate a prediction error data element, where said prediction error data element is associated with the same source state as its corresponding predicted data element;
(e) counting said prediction error data elements and storing said elements according to type and source state in order to form a plurality of symbols in each of said source states;
(f) inputting each of said symbols to a storage device as an address thereof;
(g) outputting from said storage device code words representative of each of said digital symbols;
(h) and transmitting said code words over a transmission medium.

30. The method of claim 29, wherein the step of generating a predicted data element and a corresponding source state element comprises the steps of:
addressing a second storage means using the arrangement of data elements stored in said first storage means as the address;
and outputting a predicted data element and its corresponding source state element from said second storage means for each address generated by said first storage means.

31. The method of claim 29, wherein the step of counting said prediction error data elements and storing said elements according to type and source state in order to form a plurality of symbols in each of said source states comprises the steps of:
transmitting each prediction error data element to a plurality of counters, with a separate counter used for each type and source state, until a symbol is formed in a source state;
and transmitting each symbol to a third storage means, where said symbols are stored, according to source state, in the order of formation.

32. The method of claim 29, comprising the further steps of:
(i) receiving said code words from said transmission medium;
(j) inputting each of said code words to a second storage device as an address thereof;
(k) outputting from said second storage device a symbol representative of each of said code words which is inputted,
(l) decoding said symbols by separating them into individual prediction error data elements according to type and source state;
(m) generating a predicted data element and corresponding source state element for each prediction error data element;
(n) comparing each prediction error data element to its corresponding predicted data element to generate a facsimile data element;
(o) and converting said facsimile data elements into a digital image.

33. The method of claim 32, wherein the step of decoding said symbols by separating them into individual prediction error data elements according to type and source state comprises the steps of:
transmitting said symbols from said second storage device to a plurality of counters, with a separate counter for each source state and type;
and outputting a prediction error data element from the counter corresponding to source state and data type signals received from a clock control unit.

34. The method of claim 32, wherein the step of generating a predicted data element and corresponding source state element for each prediction error data element comprises the steps of:
addressing a fourth storage means using an arrangement of facsimile data elements stored in a fifth storage means as an address;
and outputting a predicted data element and its corresponding source state element from said fourth storage means for each address generated by said fifth storage means.

* * * * *